US011307227B2

(12) United States Patent
Spanier et al.

(10) Patent No.: US 11,307,227 B2
(45) Date of Patent: *Apr. 19, 2022

(54) HIGH SPEED DIGITAL TRANSIENT WAVEFORM DETECTION SYSTEM AND METHOD FOR USE IN AN INTELLIGENT ELECTRONIC DEVICE

(71) Applicant: Electro Industries/Gauge Tech., Westbury, NY (US)

(72) Inventors: Joseph Spanier, Brooklyn, NY (US); Hai Zhu, Westbury, NY (US); Wei Wang, Mahwah, NJ (US)

(73) Assignee: Electro Industries/Gauge Tech, Westbury, NY (US)

( * ) Notice: Subject to any disclaimer, the term of this patent is extended or adjusted under 35 U.S.C. 154(b) by 540 days.

This patent is subject to a terminal disclaimer.

(21) Appl. No.: 14/194,856

(22) Filed: Mar. 3, 2014

(65) Prior Publication Data

US 2014/0176117 A1    Jun. 26, 2014

Related U.S. Application Data

(63) Continuation of application No. 12/075,747, filed on Mar. 13, 2008, now Pat. No. 8,666,688.
(Continued)

(51) Int. Cl.
*G01R 19/04* (2006.01)
*G06F 19/00* (2011.01)
(Continued)

(52) U.S. Cl.
CPC ........... *G01R 19/2509* (2013.01); *G01R 1/40* (2013.01); *G01R 19/2513* (2013.01);
(Continued)

(58) Field of Classification Search
CPC ............ G01R 19/2509; G01R 19/2513; G01R 19/04; G01R 1/40; G01R 29/02; G06F 11/30; G06F 19/00; G06F 17/40
(Continued)

(56) References Cited

U.S. PATENT DOCUMENTS 2,435,753 A * 2/1948 Richter ................. G01R 13/04
324/102
2,606,943 A   8/1952 Barker
(Continued)

FOREIGN PATENT DOCUMENTS

JP    08247783         9/1996
WO    9854583 A1      12/1998
WO    0155733 A1       8/2001

OTHER PUBLICATIONS

US 5,522,517 A1, 02/2003, Edel (withdrawn)
(Continued)

*Primary Examiner* — Catherine T. Rastovski
(74) *Attorney, Agent, or Firm* — Gerald Hespos; Michael Porco

(57) ABSTRACT

A system and a method is provided for the detection and capture, and in particular for an ultra high speed detection and capture, of transients in input voltages by an intelligent electronic device. The system and method detects transients for input voltages in either phase to phase or phase to neutral measurements and permits a user to set threshold levels for detecting transients in input voltages. In an embodiment, the system and method further provides a field programmable gate array as a controller for managing transient detection. The field programmable gate array includes a state machine for determining the state of the sampled signal with respect to a threshold level at a specified waveform sample period.

37 Claims, 10 Drawing Sheets

FIGURE 3a

Related U.S. Application Data

(60) Provisional application No. 60/921,651, filed on Apr. 3, 2007, provisional application No. 60/921,659, filed on Apr. 3, 2007.

(51) Int. Cl.
| | |
|---|---|
| *G01R 19/25* | (2006.01) |
| *G01R 1/40* | (2006.01) |
| *G06F 17/40* | (2006.01) |
| *G06F 11/30* | (2006.01) |
| *G01R 29/02* | (2006.01) |
| *G16Z 99/00* | (2019.01) |

(52) U.S. Cl.
CPC .............. *G01R 19/04* (2013.01); *G01R 29/02* (2013.01); *G06F 11/30* (2013.01); *G06F 17/40* (2013.01); *G16Z 99/00* (2019.02)

(58) Field of Classification Search
USPC ......... 73/865.8; 324/72, 76.11, 76.12, 76.38, 324/102; 340/500, 540, 657, 659, 870.01, 340/870.07; 702/1, 57, 66, 69, 79, 127, 702/187, 189
See application file for complete search history.

(56) References Cited

U.S. PATENT DOCUMENTS

| | | | |
|---|---|---|---|
| 2,883,255 A | 4/1959 | Anderson | |
| 2,987,704 A | 6/1961 | Gimpel et al. | |
| 3,142,820 A | 7/1964 | Daniels | |
| 3,166,726 A | 1/1965 | Jensen et al. | |
| 3,333,194 A | 7/1967 | Reynolds | |
| 3,453,540 A * | 7/1969 | Dusheck, Jr. | G01R 23/00 324/103 R |
| 3,467,864 A * | 9/1969 | Vander Plaats | G01R 15/183 324/102 |
| 3,504,164 A | 3/1970 | Farrell et al. | |
| 3,534,247 A | 10/1970 | Miljanic | |
| 3,535,637 A | 10/1970 | Goransson | |
| 3,629,852 A | 12/1971 | Thexton et al. | |
| 3,815,013 A | 6/1974 | Milkovic | |
| 3,824,441 A | 7/1974 | Heyman et al. | |
| 3,995,210 A | 11/1976 | Milkovic | |
| 4,140,952 A | 2/1979 | Miller | |
| 4,215,697 A | 8/1980 | Demetrescu | |
| 4,246,623 A | 1/1981 | Sun | |
| 4,255,707 A | 3/1981 | Miller | |
| 4,336,736 A | 6/1982 | Mishima | |
| 4,466,071 A | 8/1984 | Russell | |
| 4,495,463 A | 1/1985 | Milkovic | |
| 4,642,563 A | 2/1987 | McEachern et al. | |
| 4,689,752 A | 8/1987 | Fernandes et al. | |
| 4,841,236 A | 6/1989 | Miljanic et al. | |
| 4,884,021 A | 11/1989 | Hammond et al. | |
| 4,897,599 A | 1/1990 | Koslar | |
| 4,958,640 A | 9/1990 | Logan | |
| 4,996,646 A * | 2/1991 | Farrington | H02H 3/00 307/132 E |
| 5,006,846 A | 4/1991 | Granville et al. | |
| 5,014,229 A | 5/1991 | Mofachern | |
| 5,166,887 A | 11/1992 | Farrington et al. | |
| 5,170,360 A | 12/1992 | Porter et al. | |
| 5,185,705 A * | 2/1993 | Farrington | H02H 3/04 361/115 |
| 5,212,441 A | 5/1993 | McEachern et al. | |
| 5,220,495 A | 6/1993 | Pulaski | |
| 5,224,054 A | 6/1993 | Wallis | |
| 5,233,538 A | 8/1993 | Wallis | |
| 5,237,511 A | 8/1993 | Caird et al. | |
| 5,298,854 A | 3/1994 | McEachern et al. | |
| 5,298,855 A | 3/1994 | McEachern et al. | |
| 5,298,856 A | 3/1994 | McEachern et al. | |
| 5,298,859 A | 3/1994 | McEachern et al. | |
| 5,298,885 A | 3/1994 | McEachern et al. | |
| 5,298,888 A | 3/1994 | McEachern et al. | |
| 5,300,924 A | 4/1994 | McEachern et al. | |
| 5,302,890 A | 4/1994 | McEachern et al. | |
| 5,307,009 A | 4/1994 | McEachern et al. | |
| 5,315,527 A | 5/1994 | Beckwith | |
| 5,347,464 A | 9/1994 | McEachern et al. | |
| 5,402,148 A | 3/1995 | Post et al. | |
| 5,423,960 A | 6/1995 | Engelhardt et al. | |
| 5,438,257 A | 8/1995 | Berkcan | |
| 5,459,395 A | 10/1995 | Berkcan | |
| 5,475,628 A | 12/1995 | Adams et al. | |
| 5,514,958 A | 5/1996 | Germer | |
| 5,544,064 A | 8/1996 | Beckwith | |
| 5,559,719 A | 9/1996 | Johnson et al. | |
| 5,568,047 A | 10/1996 | Staver et al. | |
| 5,574,654 A | 11/1996 | Bingham et al. | |
| 5,581,173 A | 12/1996 | Yalla et al. | |
| 5,592,165 A | 1/1997 | Jackson et al. | |
| 5,675,754 A | 10/1997 | King et al. | |
| 5,706,204 A | 1/1998 | Cox et al. | |
| 5,757,357 A | 5/1998 | Grande et al. | |
| 5,758,331 A | 5/1998 | Johnson | |
| 5,764,523 A | 6/1998 | Yoshinaga et al. | |
| 5,774,366 A | 6/1998 | Beckwith | |
| 5,801,643 A | 9/1998 | Williams et al. | |
| 5,819,203 A * | 10/1998 | Moore | G01R 31/42 324/102 |
| 5,822,165 A | 10/1998 | Moran | |
| 5,825,656 A * | 10/1998 | Moore | G01R 31/42 702/60 |
| 5,832,210 A | 11/1998 | Akiyama et al. | |
| 5,874,903 A | 2/1999 | Shuey et al. | |
| 5,890,097 A * | 3/1999 | Cox | G01R 19/2513 324/76.11 |
| 5,892,758 A | 4/1999 | Argyroudis | |
| 5,898,387 A | 4/1999 | Davis et al. | |
| 5,899,960 A * | 5/1999 | Moore | G01R 31/42 324/102 |
| 5,907,238 A | 5/1999 | Owerko et al. | |
| 5,933,029 A | 8/1999 | Kuroda et al. | |
| 5,952,819 A | 9/1999 | Berkcan et al. | |
| 5,963,734 A | 10/1999 | Ackerman et al. | |
| 5,986,574 A | 11/1999 | Colton | |
| 5,994,892 A | 11/1999 | Turino et al. | |
| 5,995,911 A | 11/1999 | Hart | |
| 6,018,690 A | 1/2000 | Saito et al. | |
| 6,018,700 A | 1/2000 | Edel | |
| 6,023,160 A | 2/2000 | Coburn | |
| 6,032,109 A | 2/2000 | Ritmiller | |
| 6,038,516 A | 3/2000 | Alexander et al. | |
| 6,064,192 A | 5/2000 | Redmyer | |
| 6,073,169 A | 6/2000 | Shuey et al. | |
| 6,098,175 A | 8/2000 | Lee | |
| 6,100,817 A | 8/2000 | Mason et al. | |
| 6,112,136 A | 8/2000 | Paul et al. | |
| 6,133,720 A | 10/2000 | Elmore | |
| 3,157,329 A | 12/2000 | Lee et al. | |
| 6,163,243 A | 12/2000 | Titus | |
| 6,167,329 A * | 12/2000 | Engel | H02H 7/261 361/93.2 |
| 6,185,508 B1 | 2/2001 | Van Doorn et al. | |
| 6,186,842 B1 | 2/2001 | Hirschbold et al. | |
| 6,195,614 B1 | 2/2001 | Kochan | |
| 6,262,672 B1 | 7/2001 | Brooksby et al. | |
| 6,269,316 B1 | 7/2001 | Hubbard et al. | |
| 6,289,267 B1 | 9/2001 | Alexander et al. | |
| 6,292,717 B1 | 9/2001 | Alexander et al. | |
| 6,363,057 B1 | 3/2002 | Ardalan et al. | |
| 6,374,084 B1 | 4/2002 | Fok | |
| 6,396,421 B1 | 5/2002 | Bland | |
| 6,397,155 B1 * | 5/2002 | Przydatek | G01R 22/00 324/142 |
| 6,401,054 B1 | 6/2002 | Andersen | |
| 6,415,244 B1 | 7/2002 | Dickens et al. | |
| 6,417,661 B1 | 7/2002 | Berkcan et al. | |
| 6,429,637 B1 | 8/2002 | Gandhi | |
| 6,433,981 B1 | 8/2002 | Fletcher et al. | |
| 6,444,971 B1 | 9/2002 | Engelhardt et al. | |

(56) References Cited

U.S. PATENT DOCUMENTS

| | | | |
|---|---|---|---|
| 6,479,976 B1 | 11/2002 | Edel | |
| 6,483,291 B1 | 11/2002 | Bhateja et al. | |
| 6,493,644 B1 | 12/2002 | Jonker et al. | |
| 6,509,850 B1 | 1/2003 | Bland | |
| 6,519,537 B1 | 2/2003 | Yang | |
| 6,528,957 B1 | 3/2003 | Luchaco | |
| 6,538,577 B1 | 3/2003 | Ehrke et al. | |
| 6,542,838 B1 | 4/2003 | Haddad et al. | |
| 6,590,380 B2 | 7/2003 | Edel | |
| 6,615,147 B1 | 9/2003 | Jonker et al. | |
| 6,621,433 B1 | 9/2003 | Hertz | |
| 6,636,030 B1 | 10/2003 | Rose et al. | |
| 6,639,538 B1 * | 10/2003 | Sechi | G01W 1/16 341/155 |
| 6,657,552 B2 | 12/2003 | Belski et al. | |
| 6,661,357 B2 | 12/2003 | Bland | |
| 6,671,635 B1 | 12/2003 | Forth et al. | |
| 6,671,654 B1 | 12/2003 | Forth et al. | |
| 6,671,802 B1 | 12/2003 | Ott | |
| 6,674,379 B1 | 1/2004 | Li et al. | |
| 6,687,627 B1 | 2/2004 | Gunn et al. | |
| 6,694,270 B2 | 2/2004 | Hart | |
| 6,701,264 B2 | 3/2004 | Caso et al. | |
| 6,714,881 B2 | 3/2004 | Carlson et al. | |
| 6,717,394 B2 | 4/2004 | Elms | |
| 6,735,535 B1 | 5/2004 | Kagan et al. | |
| 6,745,138 B2 | 6/2004 | Przydatek et al. | |
| 6,751,563 B2 * | 6/2004 | Spanier | G01R 21/133 702/57 |
| 6,757,628 B1 | 6/2004 | Anderson et al. | |
| 6,759,837 B2 | 7/2004 | Gandhi | |
| 6,792,364 B2 | 9/2004 | Jonker et al. | |
| 6,829,267 B2 | 12/2004 | Vaughan et al. | |
| 6,836,737 B2 | 12/2004 | Petite et al. | |
| 6,842,707 B2 | 1/2005 | Raichle et al. | |
| 6,917,888 B2 | 7/2005 | Logvinov et al. | |
| 6,944,555 B2 | 9/2005 | Blackett et al. | |
| 6,957,158 B1 | 10/2005 | Hancock et al. | |
| 6,961,641 B1 | 11/2005 | Forth et al. | |
| 6,963,195 B1 | 11/2005 | Berkcan | |
| 6,988,043 B1 | 1/2006 | Randall | |
| 7,006,934 B2 | 2/2006 | Jonker et al. | |
| 7,010,438 B2 | 3/2006 | Hancock et al. | |
| 7,035,593 B2 * | 4/2006 | Miller | G01R 29/02 375/340 |
| 7,050,916 B2 | 5/2006 | Curtis et al. | |
| 7,072,779 B2 | 7/2006 | Hancock et al. | |
| 7,085,824 B2 * | 8/2006 | Forth | G01D 4/004 709/220 |
| 7,126,493 B2 | 10/2006 | Junker et al. | |
| 7,174,261 B2 | 2/2007 | Gunn et al. | |
| 7,191,076 B2 | 3/2007 | Huber et al. | |
| 7,209,804 B2 | 4/2007 | Curt et al. | |
| 7,239,184 B2 | 7/2007 | Cetrulo et al. | |
| 7,243,050 B2 | 7/2007 | Armstrong | |
| 7,304,586 B2 | 12/2007 | Wang et al. | |
| 7,304,829 B2 | 12/2007 | Nadipuram et al. | |
| 7,305,310 B2 | 12/2007 | Slota et al. | |
| 7,313,176 B1 | 12/2007 | Groen | |
| 7,337,081 B1 * | 2/2008 | Kagan | G01R 22/10 324/103 R |
| 7,342,507 B2 | 3/2008 | Jonker et al. | |
| 7,359,809 B2 | 4/2008 | Bruno | |
| 7,369,950 B2 | 5/2008 | Wall et al. | |
| 7,372,574 B2 | 5/2008 | Sanders et al. | |
| 7,409,303 B2 | 8/2008 | Yeo et al. | |
| 7,436,687 B2 | 10/2008 | Patel | |
| 7,444,454 B2 | 10/2008 | Yancey et al. | |
| 7,511,468 B2 | 3/2009 | McEachern et al. | |
| 7,514,907 B2 | 4/2009 | Rajda et al. | |
| 7,554,320 B2 | 6/2009 | Kagan | |
| 7,577,542 B2 | 8/2009 | Vacar et al. | |
| 7,616,656 B2 | 11/2009 | Wang et al. | |
| 7,630,863 B2 | 12/2009 | Zweigle et al. | |
| 7,660,682 B2 | 2/2010 | Slota et al. | |
| 7,761,910 B2 | 7/2010 | Ransom et al. | |
| 7,877,169 B2 | 1/2011 | Slota et al. | |
| 7,881,907 B2 | 2/2011 | Curt et al. | |
| 7,899,630 B2 * | 3/2011 | Kagan | G01R 22/10 324/103 R |
| 7,916,060 B2 | 3/2011 | Zhu et al. | |
| 7,962,298 B2 | 6/2011 | Przydatek et al. | |
| 7,974,713 B2 | 7/2011 | Disch et al. | |
| 7,996,171 B2 | 8/2011 | Banhegyesi | |
| 7,999,696 B2 | 8/2011 | Wang et al. | |
| 8,022,690 B2 | 9/2011 | Kagan | |
| 8,063,704 B2 | 11/2011 | Wu et al. | |
| 8,073,642 B2 | 12/2011 | Slota et al. | |
| 8,078,418 B2 | 12/2011 | Banhegyesi et al. | |
| 8,107,491 B2 | 1/2012 | Wang et al. | |
| 8,121,801 B2 * | 2/2012 | Spanier | G01R 19/2513 324/76.38 |
| 8,160,824 B2 | 4/2012 | Spanier et al. | |
| 8,190,381 B2 * | 5/2012 | Spanier | G01R 22/10 702/60 |
| 8,269,482 B2 | 9/2012 | Banhegyesi | |
| 8,442,660 B2 * | 5/2013 | Kagan | G01D 4/002 700/22 |
| 8,515,348 B2 | 8/2013 | Kagan | |
| 8,599,036 B2 | 12/2013 | Wang et al. | |
| 8,620,608 B2 | 12/2013 | Banhegyesi et al. | |
| 8,666,688 B2 * | 3/2014 | Spanier | G01R 19/2513 324/102 |
| 8,700,347 B2 * | 4/2014 | Spanier | G01R 22/10 702/60 |
| 8,797,202 B2 | 8/2014 | Zhu et al. | |
| 8,862,435 B2 | 10/2014 | Spanier et al. | |
| 8,878,517 B2 | 11/2014 | Banhegyesi | |
| 8,930,153 B2 | 1/2015 | Kagan et al. | |
| 8,933,815 B2 | 1/2015 | Kagan et al. | |
| 9,080,894 B2 | 7/2015 | Spanier et al. | |
| 9,092,593 B2 | 7/2015 | Nasle | |
| 9,194,898 B2 | 11/2015 | Banhegyesi et al. | |
| 9,482,555 B2 | 11/2016 | Spanier et al. | |
| 9,897,665 B2 | 2/2018 | Taft | |
| 9,903,895 B2 | 2/2018 | Banhegyesi et al. | |
| 9,989,618 B2 | 6/2018 | Spanier et al. | |
| 2001/0038343 A1 | 11/2001 | Meyer et al. | |
| 2002/0018399 A1 | 2/2002 | Schultz et al. | |
| 2002/0032535 A1 | 3/2002 | Alexander et al. | |
| 2002/0091784 A1 | 7/2002 | Baker et al. | |
| 2002/0105435 A1 | 8/2002 | Fee et al. | |
| 2002/0109608 A1 | 8/2002 | Petite et al. | |
| 2002/0120723 A1 | 8/2002 | Forth et al. | |
| 2002/0129342 A1 | 9/2002 | Kil et al. | |
| 2002/0169570 A1 * | 11/2002 | Spanier | G01R 21/133 702/61 |
| 2002/0180420 A1 | 12/2002 | Lavoie et al. | |
| 2003/0014200 A1 * | 1/2003 | Jonker | G01R 21/133 702/60 |
| 2003/0018982 A1 | 1/2003 | Zeidler et al. | |
| 2003/0025620 A1 | 2/2003 | Bland | |
| 2003/0076247 A1 | 4/2003 | Bland | |
| 2003/0093429 A1 | 5/2003 | Nishikawa et al. | |
| 2003/0154471 A1 | 8/2003 | Teachman et al. | |
| 2003/0178982 A1 | 9/2003 | Elms | |
| 2003/0178985 A1 | 9/2003 | Briese et al. | |
| 2003/0187550 A1 | 10/2003 | Wilson et al. | |
| 2003/0226058 A1 | 12/2003 | Miller et al. | |
| 2004/0113810 A1 | 6/2004 | Mason et al. | |
| 2004/0122833 A1 * | 6/2004 | Forth | G01D 4/004 |
| 2004/0128260 A1 | 7/2004 | Amedure et al. | |
| 2004/0138835 A1 | 7/2004 | Ransom et al. | |
| 2004/0167686 A1 | 8/2004 | Baker et al. | |
| 2004/0172207 A1 | 9/2004 | Hancock et al. | |
| 2004/0177062 A1 | 9/2004 | Urquhart et al. | |
| 2004/0183522 A1 | 9/2004 | Gunn et al. | |
| 2004/0193329 A1 | 9/2004 | Ransom et al. | |
| 2004/0208182 A1 | 10/2004 | Boles et al. | |
| 2005/0027464 A1 | 2/2005 | Jonker et al. | |
| 2005/0060110 A1 | 3/2005 | Jones et al. | |
| 2005/0071106 A1 | 3/2005 | Huber et al. | |

(56) References Cited

U.S. PATENT DOCUMENTS

| | | | |
|---|---|---|---|
| 2005/0093571 A1 | 5/2005 | Suaris et al. | |
| 2005/0144437 A1 | 6/2005 | Ransom et al. | |
| 2005/0165585 A1 | 7/2005 | Bhateja et al. | |
| 2005/0187725 A1 | 8/2005 | Cox | |
| 2005/0220079 A1 | 10/2005 | Asokan | |
| 2005/0240362 A1 | 10/2005 | Randall | |
| 2005/0243204 A1* | 11/2005 | Zhu | H04N 7/012 348/448 |
| 2005/0273280 A1 | 12/2005 | Cox | |
| 2005/0288876 A1 | 12/2005 | Doig et al. | |
| 2006/0047787 A1 | 3/2006 | Agarwal et al. | |
| 2006/0052958 A1 | 3/2006 | Hancock et al. | |
| 2006/0066456 A1 | 3/2006 | Jonker et al. | |
| 2006/0066903 A1 | 3/2006 | Shiimori | |
| 2006/0083260 A1 | 4/2006 | Wang et al. | |
| 2006/0085419 A1 | 4/2006 | Rosen | |
| 2006/0095219 A1 | 5/2006 | Bruno | |
| 2006/0145890 A1 | 7/2006 | Junker et al. | |
| 2006/0161360 A1 | 7/2006 | Yao et al. | |
| 2006/0200599 A1 | 9/2006 | Manchester et al. | |
| 2006/0267560 A1 | 11/2006 | Rajda et al. | |
| 2007/0058634 A1 | 3/2007 | Gupta et al. | |
| 2007/0067119 A1 | 3/2007 | Loewen et al. | |
| 2007/0067121 A1 | 3/2007 | Przydatek et al. | |
| 2007/0081597 A1 | 4/2007 | Disch et al. | |
| 2007/0096765 A1 | 5/2007 | Kagan | |
| 2007/0096942 A1 | 5/2007 | Kagan et al. | |
| 2007/0112446 A1 | 5/2007 | Deveaux et al. | |
| 2007/0114987 A1 | 5/2007 | Kagan | |
| 2007/0152058 A1 | 7/2007 | Yeakley et al. | |
| 2007/0233323 A1* | 10/2007 | Wiemeyer | H04L 43/0817 700/276 |
| 2008/0075194 A1 | 3/2008 | Ravi et al. | |
| 2008/0086222 A1* | 4/2008 | Kagan | G01D 4/002 700/22 |
| 2008/0091770 A1 | 4/2008 | Petras et al. | |
| 2008/0147334 A1* | 6/2008 | Kagan | G06Q 50/06 702/60 |
| 2008/0172192 A1 | 7/2008 | Banhegyesi | |
| 2008/0195794 A1 | 8/2008 | Banker | |
| 2008/0215264 A1* | 9/2008 | Spanier | G01R 19/2509 702/62 |
| 2008/0234957 A1 | 9/2008 | Banhegyesi et al. | |
| 2008/0235355 A1 | 9/2008 | Spanier et al. | |
| 2008/0238406 A1 | 10/2008 | Banhegyesi | |
| 2008/0238713 A1 | 10/2008 | Banhegyesi et al. | |
| 2008/0252481 A1 | 10/2008 | Vacar et al. | |
| 2009/0012728 A1* | 1/2009 | Spanier | G01R 19/2513 702/61 |
| 2009/0066528 A1 | 3/2009 | Bickel et al. | |
| 2009/0072813 A1 | 3/2009 | Banhegyesi | |
| 2009/0096654 A1 | 4/2009 | Zhu et al. | |
| 2009/0228224 A1* | 9/2009 | Spanier | G01R 22/10 702/60 |
| 2009/0265124 A1 | 10/2009 | Kagan | |
| 2010/0054276 A1 | 3/2010 | Wang et al. | |
| 2010/0153036 A1 | 6/2010 | Elwarry et al. | |
| 2010/0169876 A1 | 7/2010 | Mann | |
| 2010/0324845 A1 | 12/2010 | Spanier et al. | |
| 2011/0040809 A1 | 2/2011 | Spanier et al. | |
| 2011/0158244 A1 | 6/2011 | Long et al. | |
| 2011/0260710 A1 | 10/2011 | Zhu et al. | |
| 2011/0270551 A1 | 11/2011 | Kagan et al. | |
| 2012/0025807 A1 | 2/2012 | Banhegyesi | |
| 2012/0209057 A1 | 8/2012 | Siess et al. | |
| 2012/0209552 A1 | 8/2012 | Spanier et al. | |
| 2012/0209557 A1 | 8/2012 | Crandall et al. | |
| 2013/0158918 A1* | 6/2013 | Spanier | G01R 22/10 702/64 |
| 2014/0180613 A1 | 6/2014 | Banhegyesi et al. | |
| 2014/0222357 A1* | 8/2014 | Spanier | G01R 22/10 702/60 |
| 2017/0046458 A1 | 2/2017 | Meagher et al. | |

OTHER PUBLICATIONS

ION 7550/ION7650 User Guide Power Measurement—Revision Date Aug. 31, 2004, pp. 1-190.

ION Technology 7700 ION 3-Phase Power Meter, Analyzer and Controller, Power Measurement, specification, pp. 1-10, revision date Dec. 8, 1998.

ION Technology 7700 ION Installation & Operation Manual, Power Measurement, revision date Nov. 20, 1996, pp. 1-148.

"Power Quality—A guide to voltage fluctuation and light flicker"; BChydro Power Smart, Vancouver, B.C., Canada Dated Mar. 2005; pp. 1-12.

7700 Ion 3-Phase Power Meter, Analyzer and Controller, pp. 1-10, Dec. 8, 1998.

European Standard EN-50160; "Voltage characteristics of electricity supplied by public distribution networks"; Copyright 2007 CENELEC; published Oct. 31, 2007; pp. 1-23.

Futura+Series, "Advanced Power Monitoring and Analysis for the 21st Century", Electro Industries/Gauge Tech, specification, 8 pages, Apr. 13, 2000.

IEC 61000-4-15: Electromagnetic compatibility (EMC) Part 4: Testing and measuring techniques, Section 15 Flickermeter—Functional and design specifications; CENELEC—European Committee for Electrotechnical Standardization; Apr. 1998.

IEEE Std 1159-1995; IEEE Recommended Practice for monitoring Electric Power Quality; Copyright The Institute of Electrical and Electronics Engineers, Inc. 1995; New York, NY; pp. 1-76.

IEEE Std 519-1992; IEEE Recommended Practices and Requirements for Harmonic Control in Electrical Power Systems; Copyright The Institute of Electrical and Electronics Engineers, Inc. 1993; New York, NY; pp. 1-101.

International Standard IEC-1180-1; "High-voltage test techniques for low-voltage equipment"; Copyright Commission Electrotechnique Commission 1992; Geneva, Switzerland; pp. 1-62.

International Standard IEC-61000-2-4, Second Edition; "Electromagnetic compatibility (EMC)—Part 2-4:Enviroment-Compatibility levels in industrial plants for low-frequency conducted distribances"; Copyright Commission Electrotechnique Commission 2002; Geneva, Switzerland; pp. 1-84.

International Standard IEC-61000-4-30, First Edition; "Electromagnetic compatibility (EMC)—Part 4-30:Testing and neasurement techniques—Power quality measurement methods"; Copyright Commission Electrotechnique Commission 2003; Geneva, Switzerland; pp. 1-98.

International Standard IEC-61000-4-7, Second Edition; "Electromagnetic compatibility (EMC)—Part 4-7:Testing and neasurement techniques"; Copyright Commission Electrotechnique Commission 2002; Geneva, Switzerland; pp. 1-80.

International Standard IEC-687, Second Edition; "Alternating current static watt-hours meters for active energy"; Copyright Commission Electrotechnique Commission 1992; Geneva, Switzerland; pp. 1-36.

Ion Technology, 7500 Ion 7600 Ion High Visibility Energy & Power Quality Compliance Meters, Power Measurement, specification, pp. 1-8, revision date Nov. 30, 2000.

ION Technology, 7500 ION High Visibility 3-Phase Energy & Power Quality Meter, Power Measurement, specification, pp. 1-8, revision date Mar. 21, 2000.

ION7550/Ion7650 PowerLogic power-monitoring units, Technical data sheets, Copyright 2006 Schneider Electric.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro Industries/Gauge Tech, specification, 16 pages, Nov. 1999.

Performance Power Meter & Data Acquisition Node, Electro Industries/Gauge Tech., Nexus 1250 specification, 8 pages, Dec. 14, 2000.

Power Platform 4300 Multi-DAQ TASKCard Operator's Manual; Dranetz-BMI, Original Issue—Jul. 2002, pp. 203.

Power Platform PP1 &PP1E TASKCard-lnrush Operator's Manual; Dranetz-BMI, Revision A—Apr. 15, 1997, pp. 231.

PowerLogic Series 4000 Circuit Monitors, pp. 1-4; Document #3020HO0601; Jan. 2006.

(56) References Cited

OTHER PUBLICATIONS

Series 5500 InfoNode User's Guide; Dranetz-BMI, Edison, NJ; Copywright 1999, 2002, 2004; pp. 1-220.
The Dranetz Field Handbook for Power quality Analysis; Dranetz Technologies Incorporated, Edison, NJ; Copyright 1991; pp. 1-271.
User's Installation & Operation and User's Programming Manual. The Futura Series, Electro Industries, pp. 1-64, Copyright 1995.
Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.

\* cited by examiner

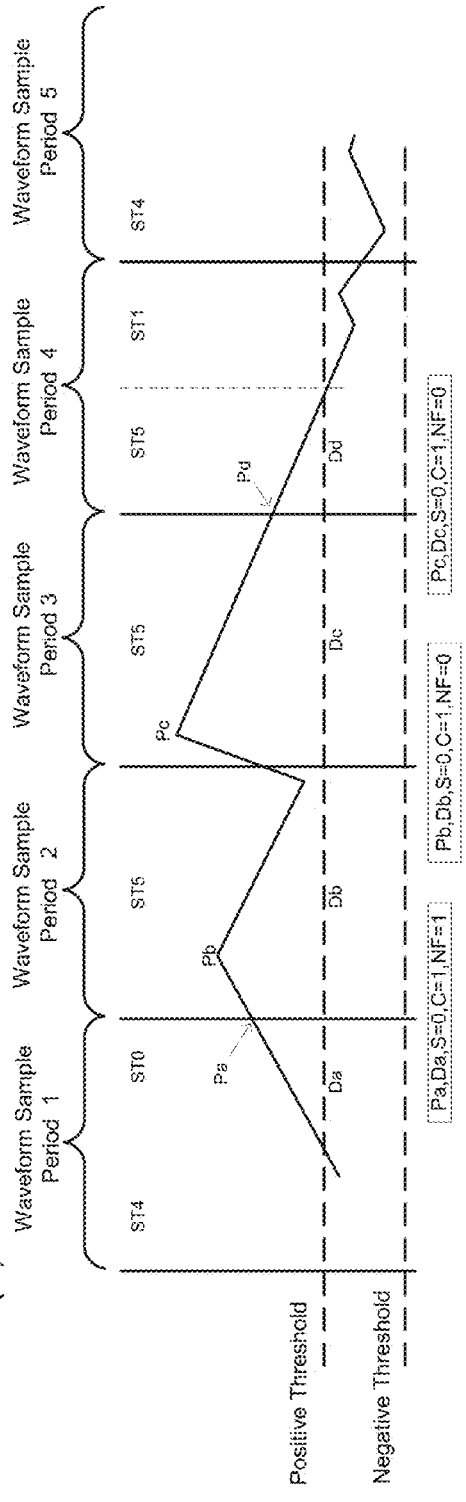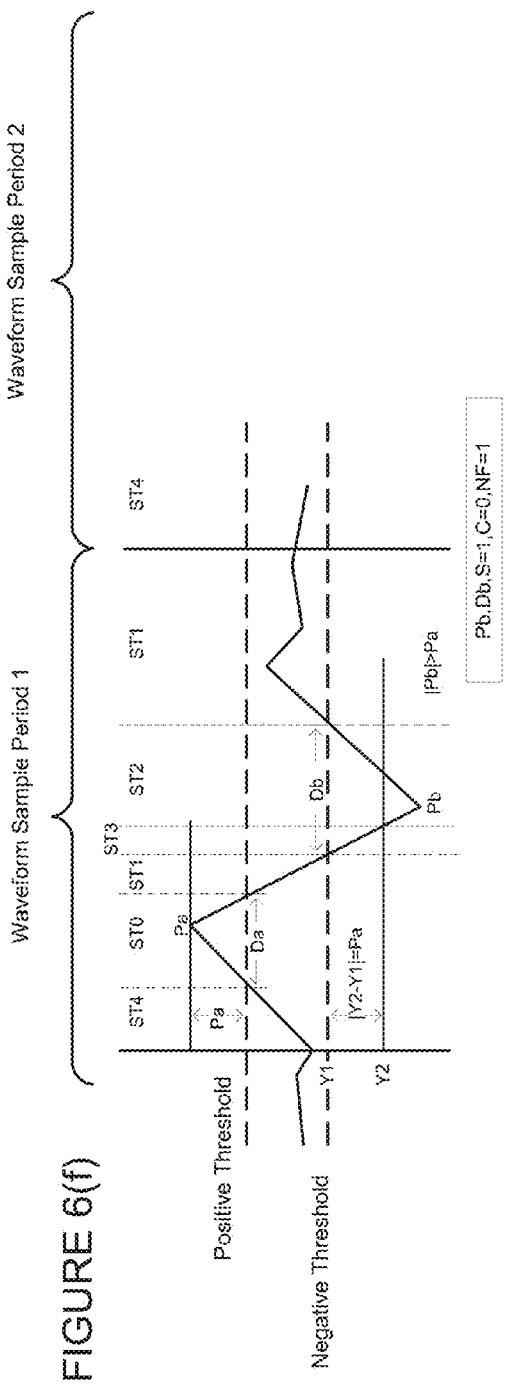

HIGH SPEED DIGITAL TRANSIENT WAVEFORM DETECTION SYSTEM AND METHOD FOR USE IN AN INTELLIGENT ELECTRONIC DEVICE

PRIORITY

This application is a continuation application of U.S. patent application Ser. No. 12/075,747, filed on Mar. 13, 2008, now U.S. Pat. No. 8,666,688, the contents of which are hereby incorporated by reference in its entirety.

This application is related to U.S. patent application Ser. No. 12/036,356 filed on Feb. 25, 2008, now U.S. Pat. No. 7,889,630, which is a continuation application of U.S. patent application Ser. No. 11/341,802 filed on Jan. 27, 2006 entitled "METERING DEVICE WITH CONTROL FUNCTIONALITY AND METHOD THEREOF", now U.S. Pat. No. 7,337,081, which claims priority to U.S. Provisional Patent Application Ser. No. 60/647,669 filed on Jan. 27, 2005, the contents of which are hereby incorporated by reference in their entireties.

This application also claims priority to a provisional application entitled "INTELLIGENT ELECTRONIC DEVICE WITH ENHANCED POWER QUALITY MONITORING AND COMMUNICATIONS CAPABILITIES" filed in the United States Patent and Trademark Office on Apr. 3, 2007 and assigned Ser. No. 60/921,651, and a provisional application entitled "HIGH SPEED DIGITAL TRANSIENT TRIGGERING AND CAPTURE SYSTEM AND METHOD FOR USE IN AN INTELLIGENT ELECTRONIC DEVICE" filed in the United States Patent and Trademark Office on Apr. 3, 2007 and assigned Ser. No. 60/921,659, the contents of which are hereby incorporated by reference.

BACKGROUND

1. Field

The present disclosure relates generally to the measurement of A.C. power systems, and more particularly, to an ultra high speed and flexible transient waveform detection system for use in an intelligent electronic device (IED).

2. Description of the Related Art

Transients are rapid changes in steady state conditions for voltages and currents. Transients can occur in all A.C. power systems. Transients designate a phenomenon or a quantity that varies between two consecutive time states at a shorter time waveform sample period than the measured waveform sample period of interest. If a voltage transient exceeds a voltage dip and/or a voltage swell threshold, the transient will be recorded as a voltage dip or swell. Various conditions such as weather conditions, lightning strikes, power surges and swells, blackouts, brownouts, and fault conditions can severely compromise power quality monitoring capabilities by IEDs.

Based on the foregoing, it is therefore desirable to have a flexible, high-speed, transient waveform detection system for use in an intelligent electronic device.

SUMMARY

The present disclosure provides a transient waveform detection system and a method for use in an intelligent electronic device (IED). As will be described, the transient waveform detection system is configured to test the power quality and usage at any metered point within a power distribution system. The system finds particular, but not exclusive, application in the ultra high speed detection and capture of transients.

In an embodiment, the transient waveform detection system detects and measures transients on voltage input channels of the TED, which are coupled to by a power distribution system, while avoiding the introduction of crosstalk from waveform capture and revenue measurement circuits. Beneficially, the transient waveform detection system provides faster and more sensitive measurement of the transients than conventional systems and also provides system output data to better analyze the detected transients. The system also flexibly allows a user to set threshold levels for detecting transients for the input voltages.

In some embodiments, the transient waveform detection system may detect transients on a plurality of input voltage channels using either phase to phase measurements or phase to neutral measurements.

In one embodiment, the transient waveform detection system includes a field programmable gate array (FPGA) for use as a controller for controlling a transient detector. The FPGA includes a state machine for determining the state of a sampled signal with respect to a threshold level at a specified waveform sample period. The transient detector is configured to capture and measure the duration of a detected signal to determine whether the captured signal is in fact a transient signal, based on its amplitude. The duration data may also be utilized for analysis purposes.

In one embodiment, the transient waveform detection system is incorporated into the body of an intelligent electronic device (IED) and includes, inter alia, a plurality of analog to digital circuits (A/D), a transient detector, a state machine, comparator circuitry and a multiplexer/subtractor circuit. In an embodiment, the transient detector, state machine, comparator circuitry, and multiplexer/subtractor circuit are incorporated into a field programmable gate array configured to receive digital samples of captured transients obtained from the analog to digital circuits (A/D).

The transient detector further includes comparator circuitry for comparing transient values as well as threshold values; latch circuitry for storing peak transient values; at least one duration counter for storing duration values of the identified peak transient values; at least one storage device for storing and outputting transient data. The comparator circuitry determines whether a transient is a positive or a negative going transient, dependent upon pre-set positive and negative threshold values. The transient waveform detection system further includes additional FPGA functionality for communicating data between the A/D converters and at least one DSP processor or a CPU besides the transient processing circuitry.

According to a further aspect of the present disclosure, a method for detecting transients in input voltage channels is provided, the steps including: a) receiving a plurality of transient samples from said input analog voltage waveform in successive waveform sample periods; b) comparing a currently received transient sample with a previously latched input transient sample in each of said waveform sample periods; c) determining if the currently received transient sample is greater than the previously latched input transient sample in each of said waveform sample periods; d) overwriting the previously latched input transient sample with the current transient sample in the case where said determining step is satisfied in each of said waveform sample periods; e) identifying a peak transient corresponding to the currently latched input transient at the end of each of said waveform sample periods.

BRIEF DESCRIPTION OF THE DRAWINGS

FIG. 6(a)-6(f) are graphs for illustrating the transient detector of transients at various states of the state machine of FIG. 4a.

DETAILED DESCRIPTION OF THE PREFERRED EMBODIMENTS

Preferred embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

I—General Overview of an IED

As used herein, intelligent electronic devices ("LED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering. A popular type of power meter is a socket-type power meter, i.e., S-base or Type S meter. As its name implies, the meter itself plugs into a socket for easy installation, removal and replacement. Other meter installations include panel mounted, switchboard mounted, and circuit breaker mounted. Additional meter forms include switchboard drawout forms, substation panel metering forms, and A-base front wired forms. Typically, the power meter connects between utility power lines supplying electricity and a usage point, namely, a residence or commercial place of business.

The present disclosure describes an intelligent electronic device (IED), e.g., a power meter, configured to split and distribute front end voltage and current input channels, carrying front end voltages and currents, into separate circuit paths (revenue measurement circuit path, transient detection and measurement circuit path, and a waveform measurement circuit path) for the purpose of scaling and processing the front end voltages and currents by dedicated processors or processing functions. The present disclosure is particularly directed to the configuration and operation of the transient detection and measurement circuit path.

Figure 1:
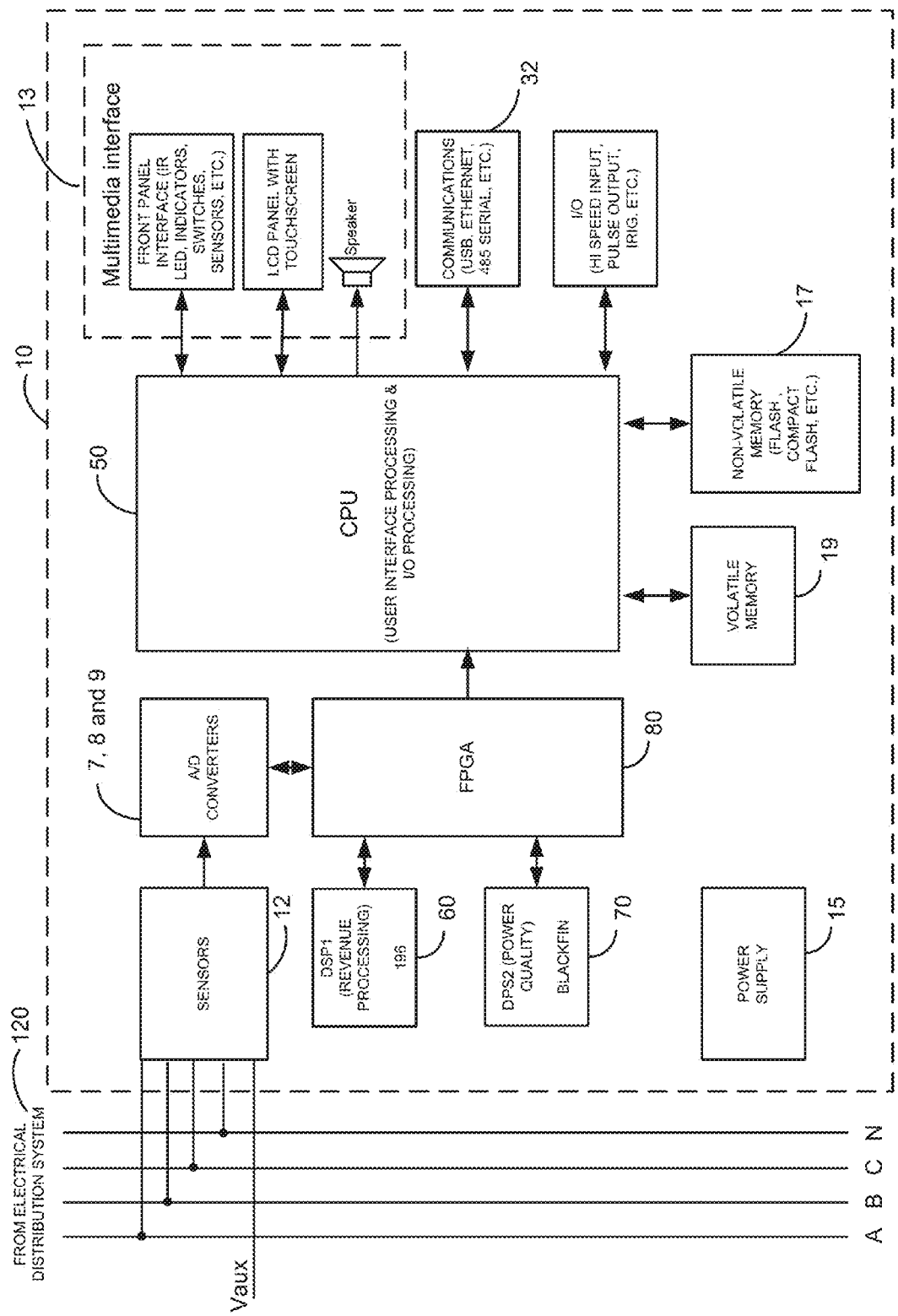
FIG. 1 is an overall block diagram of an TED system of the present disclosure, according to one embodiment.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 120, a plurality of analog-to-digital (A/D) converters 7, 8, 9, including inputs coupled to the sensor 12 outputs, a power supply 15, a volatile memory 19, an non-volatile memory 17, a multimedia user interface 13, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 7, 8, 9 performing transient detection and capture and performing memory decoding for CPU 50 and the DSP processor 60. The FPGA 80 is internally comprised of two dual port memories to facilitate the various functions, as will be described further below.

The plurality of sensors 12 sense electrical parameters, e.g., voltage and current, on incoming lines, (i.e., phase A, phase B, phase C, neutral N), from an electrical power distribution system.

A/D converters 7, 8, 9 are respectively configured to convert an analog voltage output from the sensors 12 to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 7, 8 and 9 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other well-known or envisioned programmable logic device in place of the FPGA 80. In some embodiments, the digital samples, which are output from the A/D converters 7, 8, 9 are sent directly to the CPU 50 or DSP processors 60, 70, effectively bypassing the FPGA 80 as a communications gateway.

The power supply 15 provides power to each component of the IED 10. Preferably, the power supply 15 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 15. For example, power may be supplied from a different electrical circuit or an uninterruptible power supply (UPS).

In one embodiment, the power supply 15 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 13 is shown coupled to the CPU 50 in FIG. 1 for interacting with a user and for communicating events, such as alarms and instructions to the user. The multimedia user interface 13 preferably includes a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 13 further includes a speaker or audible output means for audibly producing instructions, alarms, data, etc. The speaker is coupled to the CPU 50 via a digital-to-analog converter (D/A) for converting digital audio files stored in a memory 19 or non-volatile memory 17 to analog signals playable by the speaker. An exemplary interface is disclosed and described in commonly owned U.S. application Ser. No. 11/589,381, now U.S. Pat. No. 8,442,660, entitled "POWER METER HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The IED 10 will support various file types including but not limited to Microsoft™ Windows™ Media Video files (.wmv), Microsoft™ Photo Story files (.asf), Microsoft™ Windows™ Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft™ Recorded TV Show files (.dvr-ms), Microsoft™ Windows™ Video files (.avi) and Microsoft™ Windows™ Audio files (.wav).

The IED 10 further comprises a volatile memory 19 and a non-volatile memory 17. In addition to storing audio and/or video files, volatile memory 19 will store the sensed and generated data for further processing and for retrieval when called upon to be displayed at the IED 10 or from a remote location. The volatile memory 19 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

In a further embodiment, the IED 10 will include a communication device 32 for enabling communications between the IED, and a remote terminal unit, programmable logic controller and other computing devices, microprocessors, a desktop computer, laptop computer, other meter modules, etc. The communication device 32 may be a modem, network interface card (NIC), wireless transceiver, etc. The communication device 32 will perform its functionality by hardwired and/or wireless connectivity. The hardwire connection may include but is not limited to hard wire cabling e.g., parallel or serial cables, RS232, RS485, USB cable, Firewire™ (1394 connectivity) cables, Ethernet, and the appropriate communication port configuration. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee™, WiFi™, or any mesh enabled wireless communication.

The IED 10 may communicate to a server or other computing device via a communication network. The IED 10 may be connected to a communications network, e.g., the Internet, by any known means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any known network that couples a plurality of computers to enable various modes of communication via network messages. Furthermore, the server will communicate using the various known protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing the waveform, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data or in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are used to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563 which all contents thereof are incorporated by reference herein. As disclosed in U.S. Pat. No. 6,751,563, the meter is installable as a socket type meter, a panel mounted meter, a switchboard mounted meter, or a circuit breaker meter.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

The IED 10 of the present disclosure can compute a calibrated VPN (phase to neutral) or VPP (phase to phase) voltage RMS from VPE (phase to earth) and VNE (neutral to earth) signals sampled relative to the Earth's potential, where Phase P may be, for example, Phase A, B or C of a three phase system 120. The desired voltage signal can be produced by subtracting the received channels, for example the phase to neutral voltage $V_{PN}=V_{PE}-V_{NE}$. Calibration involves removing (by adding or subtracting) an offset (o, p) and scaling (multiplying or dividing) by a gain (g, h) to produce a sampled signal congruent with the original input signal.

The RMS is the Root-Mean-Square value of a signal, the square root of an arithmetic mean (average of n values) of squared values. Properly combined, one representation of this formula is:

$$V_{AN} = \sqrt{\frac{\sum_n (g(V_{AE} - o) - h(V_{NE} - p))^2}{n}}$$

where $V_{AN}$ is the voltage from phase A to neutral, $V_{AE}$ is the voltage measured from phase A to earth, $V_{NE}$ is the voltage measured from neutral to earth and n is the number of values taken.

Implementation of the computation in this arrangement is comparatively inefficient, in that many computations involving constants (−o, −p, g, h) are performed n times, and that computational precision can either be increased, forcing the use of large numbers (requiring increased memory for storage and increased time to manipulate), or be degraded, increasing the uncertainty. However, a mathematical rearrangement can be carried out on the above formula, producing an equivalent computation that can be carried out more efficiently, decreasing the effort needed to produce similar or superior results. That representation is:

$$V_{AN} = \sqrt{g^2 \left( \frac{\sum_n V_{AE}^2 - 2o \sum_n V_{AE}}{n} + o^2 \right) - 2gh \left( \frac{\sum_n V_{AE} V_{NE} - o \sum_n V_{NE} - p \sum_n V_{AE}}{n} + op \right) + h^2 \left( \frac{\sum_n V_{NE}^2 - 2p \sum_n V_{NE}}{n} + p^2 \right)}$$

where −o, −p, g and h are constants and $V_{AN}$ is the voltage from phase A to neutral, $V_{AE}$ is the voltage measured from phase A to earth, $V_{NE}$ is the voltage measured from neutral to earth and n is the number of values taken.

Implementation of the computation in this arrangement can be accomplished with more efficiency and precision. All involvement of constants has been shifted to single steps, removed from the need to be applied n times each. This savings in computation can then be partially utilized to perform slower but more precise applications of the gains and Square Root. The result is a value of equal or higher precision in equal or lesser time.

These calculations are preferably implemented in software by at least one processor such as the CPU 50 or, in the alternative, by at least one DSP Processor 70 and at least one FPGA 80.

II—Overview of Front End Voltage Distribution

Figure 2:
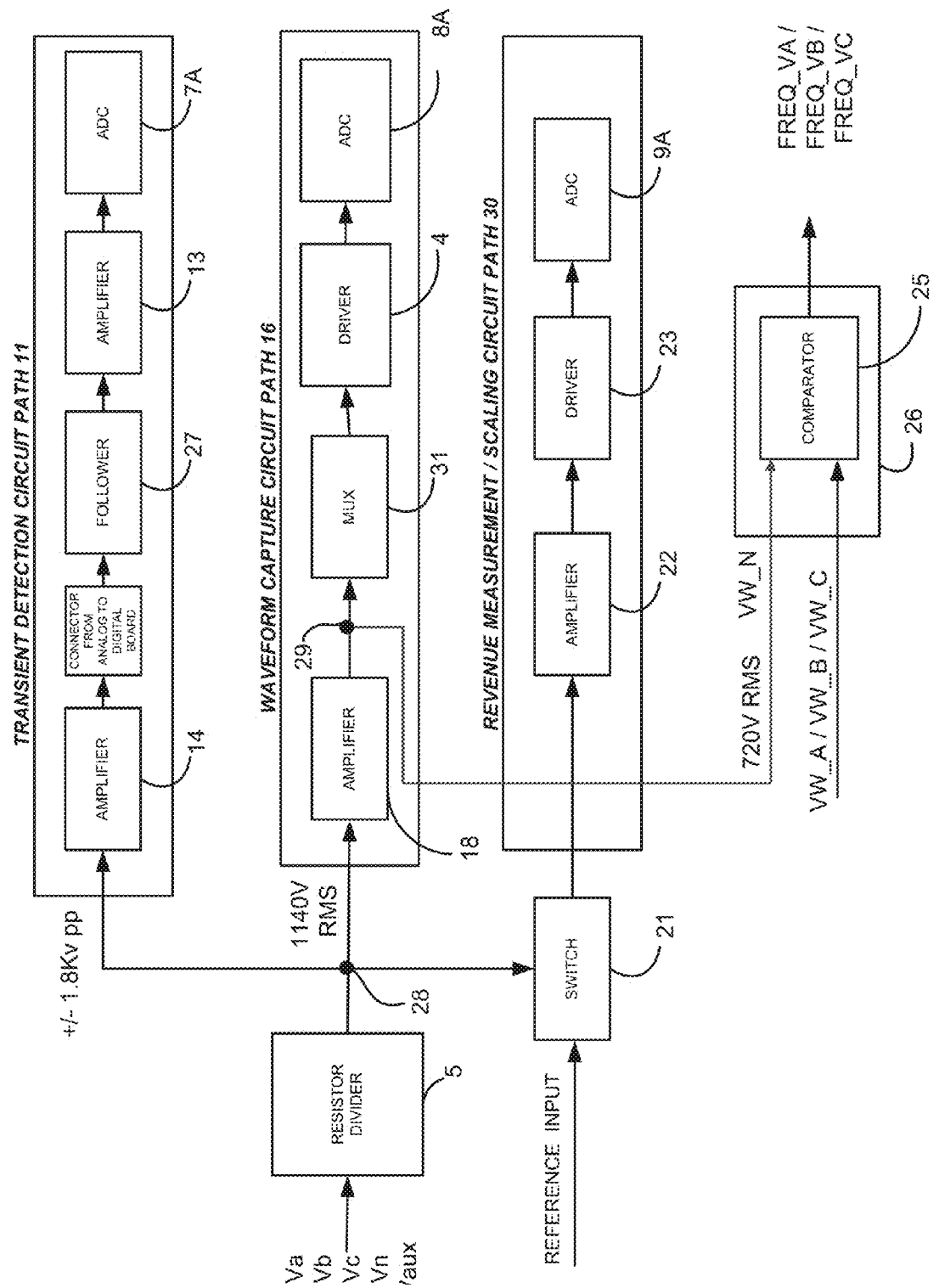
FIG. 2 is a block diagram of a circuit illustrating how front end voltage input channels are distributed to dedicated circuit paths: a transient detection, waveform capture path, and billing measurement path, to be scaled for processing by particular TED applications in accordance with one embodiment of the present disclosure.

FIG. 2 is a block diagram of a circuit illustrating how front end voltage input channels are distributed to dedicated circuit paths: transient detection 11, waveform capture 16, and billing measurement 30, to be scaled for processing by particular TED 10 applications in accordance with one embodiment of the present disclosure. The present disclosure is particularly directed to the transient detection path 11.

Referring now to FIG. 2, in operation, voltage channels are applied to an input of a resistance divider 5 of the circuit. The resistance divider 5 reduces potential high voltage levels of the voltage channels to allow for proper handling by the various circuits. The resistance divider 5 provides a reduced voltage level which is then split at Point "28" into three circuit paths, transient detection 11, waveform capture 16, and billing measurement 30, to be scaled for processing by particular IED 10 applications in accordance with embodiments of the present disclosure. It should be understood that the number of circuit paths used can vary depending on the number of particular IED applications that are intended to be performed.

The three circuit paths 11, 16 and 30 shown in FIG. 2 correspond to respective applications of the IED 10 including; transient capture/scaling circuit, associated with path 11, waveform capture, associated with path 16 and revenue measurement, associated with path 30.

Transient Capture/Scaling Circuit Path 11

A transient signal conditioning and analog to digital conversion path 11, referred to hereafter as the transient capture/scaling circuit path 11, is configured to perform signal conditioning and scaling operations on the electrical distribution system 120 three-phase input voltage channels Va, Vb, Vc to enable the detection and measurement of transients on the conditioned/scaled input voltage channels by a transient measurement circuit, to be described below.

Because the transient capture/scaling circuit path 11 performs signal conditioning and scaling on a three-phase input voltage channel, i.e., Va, Vb, Vc, the circuitry is duplicated for each voltage phase, Va, Vb, Vc and Vn (neutral) although only one circuit is shown.

The transient capture/scaling circuit path 11 singles out high speed voltage events on the conditioned/scaled input voltage channels that would otherwise be missed by the waveform capture analog-to-digital converters (ADCs) 8a of the waveform capture circuit 16. The transient capture/scaling circuit path 11 is converting at a relatively low bit resolution, but at high speed. This will enable the TED to capture a wide dynamic range of very high speed signals. This is opposed to the waveform capture circuit in which the bit resolution of the A/D converters is high. Standard technology does not allow for high resolution and high-speed conversion. Thus, by utilizing both paths, the meter will be able to record accurate power measurements and capture high speed transients.

The transient capture/scaling circuit path 11 includes four circuit elements as shown in FIG. 2, a first amplifier 14 having a unit gain, a follower 27, a second amplifier 13 and an A/D converter 7A. Scaling and offset operations are performed by the combination of the first amplifier 14, follower 27 and the second amplifier 13. The scaled and offset voltages, output from the second amplifier 13, are supplied to the dedicated A/D converter 7A which outputs a digitized/scaled output voltage to FPGA 80 (See FIG. 1).

A resistor divider at the output of the first amplifier 14 applies a gain adjustment to the input voltage channels, Va, Vb and Vc. The gain adjustment is set to provide an output amplified voltage in an acceptable range of the A/D converter 7A.

The follower 27 separates the gain stages and the offset of the first and second amplifiers 13, 14. In other words, the follower 27 provides isolation between the first and second amplifiers 13, 14 so that there is no detrimental loading effect from amplifier 13. Specifically the offset adjust circuitry of amplifier 13 must be isolated from amplifier 14. This also allows each amplifier 13, 14 to be independently adjusted. Without follower 27, a change in offsetting would adversely affect the gain of the previous stage, i.e., the gain provided from amplifier 14.

The second amplifier 13 offsets the transient voltage which is supplied from the amplifier 13 as input to the A/D converter 7A. This is required in that the A/D converter 7A only accepts a unipolar input voltage, for example, in the range of 0 to 2 volts.

The A/D converter 7A is representative of a block of A/D converters. The A/D converter 7A receives conditioned/scaled transient voltages Va, Vb, Vc and Vn as input and outputs a digitized/scaled output voltage. It is noted that transient voltages are only measured on Vn in a phase-to-neutral measurement mode. In a phase-to-phase measurement mode, phase-to-phase transients do not use Vn as an input.

The transient capture/scaling circuit path 11 is capable of scaling a wide range of input voltages on the voltage channel inputs, Va, Vb, Vc. By way of example, the transient capture/scaling circuit path 11 can scale input voltages of ±1800 volts peak to peak. It should be appreciated that the actual voltage dynamic range of the transient capture/scaling circuit path 11 can be modified as per customer specifications. It should be noted that the transient capture/scaling circuit path 11 is configured to handle peak to peak voltages.

The transient capture/scaling circuit path 11 has a very high bandwidth, on the order of 10 Mhz, that can be clocked substantially in the range from 1 MHz to 50 MHz or greater The combination of the transient scaling circuit's scaling capabilities (for over ranging voltage), high bandwidth and very high sample rate make possible accurate measurement and capture of the high speed transient without distorting the transient characteristics.

An exemplary operation of the transient capture/scaling circuit path 11 is now described. In operation, an input channel voltage range of ±1800 peak to peak volts is reduced by a resistor divider 5. Reduction is from ±1800 peak to peak volts to ±5.5 peak to peak volts. In one embodiment, the transient capture/scaling circuit path 11 has a gain of 1/5.53 (i.e., 0.18). A positive offset voltage of 1.00 volts is added to the signal output of amplifier 14 to ensure that the output voltage of amplifier 13 is always positive. For example, a +/−5.5 peak to peak volt input to amplifier 14 results in a output voltage in the range of +/−0.997 volts which ensures that the output voltage of amplifier 13 will be positive.

Amplifier 13 provides an offset voltage of 1.00 v so that an output range of amplifier 13 is in the range of 0.00446v to +1.9954v, to be provided as input to the A/D converter 7A. It should be appreciated that the afore-mentioned voltage scaling operations, described above, are needed for the high speed A/D converter 7A.

One non-limiting circuit component that can be used for A/D converter 7A is a low power, 8 bit, 20 MHz to 60 MHz A/D converter. One representative component having these attributes is the ADC08L060, which is commercially available from National Semiconductor, Santa Clara, Calif. It should be understood, however, that the IED 10 of the present disclosure is not limited to any particular component for performing A/D conversion.

The transient capture/scaling circuit path 11, described above, is necessary to scale down the input voltage channels so that the input voltage range of the A/D converter 7A, can be met which may be implemented with a ADC08L060 converter or any suitable alternative. Use of the ADC08L060 component or any suitable alternative guarantees that a high speed sampling rate, on the order of 50 MHZ or greater will be possible for making transient measurements, including making transient measurements, on the scaled down input voltage channels. Details pertaining to the scaling circuitry is described more fully in co-pending U.S. patent application Ser. No. 12/075,690 filed on Mar. 13, 2008, now U.S. Pat. No. 8,190,381, entitled "INTELLIGENT ELECTRONIC DEVICE WITH ENHANCED POWER QUALITY MONITORING AND COMMUNICATIONS CAPABILITIES", which claims priority to U.S. Provisional Application Ser. No. 60/921,651 filed on Apr. 3, 2007, and is incorporated herein by reference.

Waveform Capture/Scaling Circuit Path 16

Similar to that described above for the transient capture/scaling circuit path 11, waveform capture/scaling circuit path 16 receives a three-phase power input. Accordingly, the circuitry 16 is duplicated for each voltage phase, Va, Vb, Vc and Vn (neutral) of the three-phase power input. The waveform capture scaling circuit path 16 is further duplicated for an auxiliary input, Vaux.

The waveform capture scaling circuit 16 is provided with a scaled input voltage signal from the resistor divider 5, which is common to all paths (i.e., transient capture/scaling circuit path 11, waveform capture circuitry path 16 and billing circuitry path 30). The scaled input voltage signal is supplied as input to amplifier 18, which isolates the multiplexer 31 from the transient capture/scaling circuit path 11 and billing circuitry path 30 by amplifier 18.

The waveform capture circuit 16 receives several channels at input amplifier 18 for scaling. Some of the scaled channels, which are output from the amplifier 18, at point "29", are then provided as input to a multiplexer 31. That is, not all input channels go the multiplexer 31. Because the A/D converter 8A is limited to six channels, the following signal pairs are multiplexed: Va or Vaux, Vc or Vb, Ia or Ib. Channels, Vn, In and Ic go directly from the amplifier to the driver 4. The multiplexer 31 multiplexes the scaled channels for the A/D converter 8A that is dedicated to the waveform capture scaling circuit 16.

The multiplexed signals, which are output from multiplexer 31, are provided as input to the driver 4, which is followed by the A/D converter 8A. It is noted that the A/D converter 8A is actually comprised of a block of A/D converters. More particularly, A/D converter 8A is a multichannel A/D converter for converting both voltage and current inputs. To allow for conversion of all of the channels, the multiplexer 31 selects from among the various inputs and a conversion is performed in two steps.

From the A/D converter 8A, the input channels go into the FPGA 80 (see FIG. 1) to the DSP Processor 70. The DSP Processor 70 provides digital signal processing and the waveform analysis is focused on seeing more of the signal even though accuracy is reduced as there is more interest in quality of power and not accuracy. Thus while both A/D converters for the waveform scaling analysis circuit 16 and for the billing measure circuit path 30 each have 16 bit resolution, there is a difference in the range of input for the revenue A/D converter 9 (A/D converter 9 is a block of A/D converters that includes at least one A/D converter) and for the waveform capture A/D converter 8A due to the difference in the scaling input for each of these two converters. So the range of input of both the A/D revenue converter 9 and the A/D waveform capture converter 8 are different from each other.

Zero Crossing Circuit 26

With reference to FIG. 2, there is shown a zero crossing circuit 26, which may be connected to the waveform, capture circuit 16 in certain embodiments. The zero crossing circuit 26 is only applicable to input voltage channels Va, Vb, Vc and Vaux (auxiliary voltage input).

The operation of the zero crossing circuit 26 of FIG. 2 is as follows, according to one embodiment. The input voltage channels, which contain both fundamental and harmonic sinusoidal signals, after amplification in amplifier 18, are fed into a comparator 25. The comparator 25 produces a high output when the input is positive, and a low output when the signal is negative, thus transforming the input signal into a pulse train which transitions at each zero crossing.

The output of comparator 25 is fed into whichever processor includes the firmware for processing the zero crossing application. This could be the CPU 50 (Host Processor) or DSP Processor 70 or DSP Processor 60 or FPGA 80.

Frequency computation is performed using the output of comparator 25. The processor detects the time of each transition, and computes the duration between each transition. The presence of harmonics in the signal is such that the durations might significantly differ from that expected from the pure fundamental. Durations that are significantly shorter or longer than expected are ignored; durations that fall within acceptable limits are counted and accumulated. Periodically, the accumulated duration is divided by the count of durations, giving an average duration, from the inverse of which the average frequency can be computed.

Sampling and computations can occur in one of two ways, based on the frequency computation. In situations where a fixed sample rate is used, computations are based on the number of samples that would be taken over the period of the computed frequency; as the frequency varies, the number of samples in a cycle varies, while maintaining a fixed sample rate. Alternatively, in situations where synchronous sampling is needed, the sample period is computed as the desired fraction of the period of the computed frequency; as the frequency varies, the sample rate varies while maintaining a fixed number of samples per cycle.

Revenue Measurement/Scaling Circuit Path 30

The revenue measurement/scaling circuit path 30 is operable to measure input voltage phases: Va, Vb, Vc and Vn and input current channels Ia, Ib, Ic and In. Revenue measure circuit path 30 is comprised of a calibration switch 21, an amplifier 22, a driver 23 and A/D converter 9A.

III—Overview of Transient Waveform Detection System

Figure 3A:
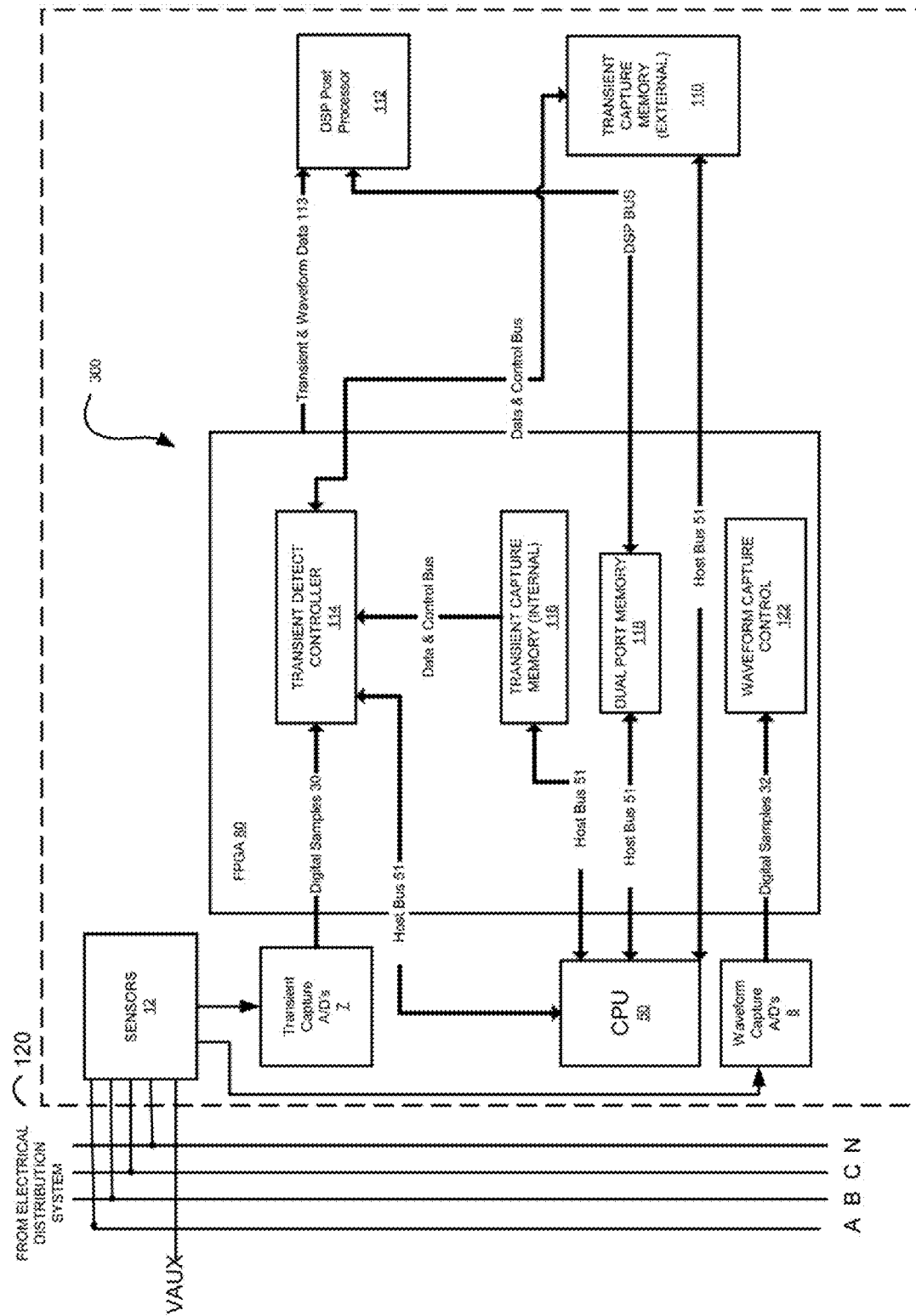
FIG. 3a illustrates an overall block diagram of the transient waveform detection system of the present disclosure, according to one embodiment.

FIG. 3a illustrates an overall block diagram of the transient waveform detection system 300 of the present disclosure, according to one embodiment. Generally, the transient waveform detection system provides speed and scaling for over ranging voltage and a high bandwidth to compliment the high transient sampling rate, on the order of 50 Mhz. The system also provides an over range capability, on the order of +/−1800 peak to peak volts (ppv).

With continued reference to FIG. 3a, there is shown three voltages Va, Vb, Vc and a neutral Vn, which may be supplied from a power distribution system 120, i.e., power grid. The three voltages are input to a high bandwidth transient capture A/D converter circuit 7 that can be clocked at 50 MHz or greater. The transient capture A/D converter circuit 7 is required to operate at a minimum sampling rate of at least 50 MHZ to capture the voltage transients. In addition to being input to the transient capture A/D converter circuit 7, the four input analog voltage channels, Va, Vb, Vc and Vn are simultaneously input to a waveform capture A/D converter circuit 8A in FIG. 2 that has higher resolution and lower bandwidth, typically clocked between 2 KHz to 100 KHz.

It should be understood that all operations of the transient waveform detection system 300 are defined in the context of a waveform sample period. This is shown by way of example in FIG. 3b. In an exemplary embodiment, illustrated in FIG. 3b, the transient waveform detection system 300 operates at a system clock frequency of 61.44 Khz which corresponds to a waveform sample period of 16.67 microseconds.

Figure 3B:
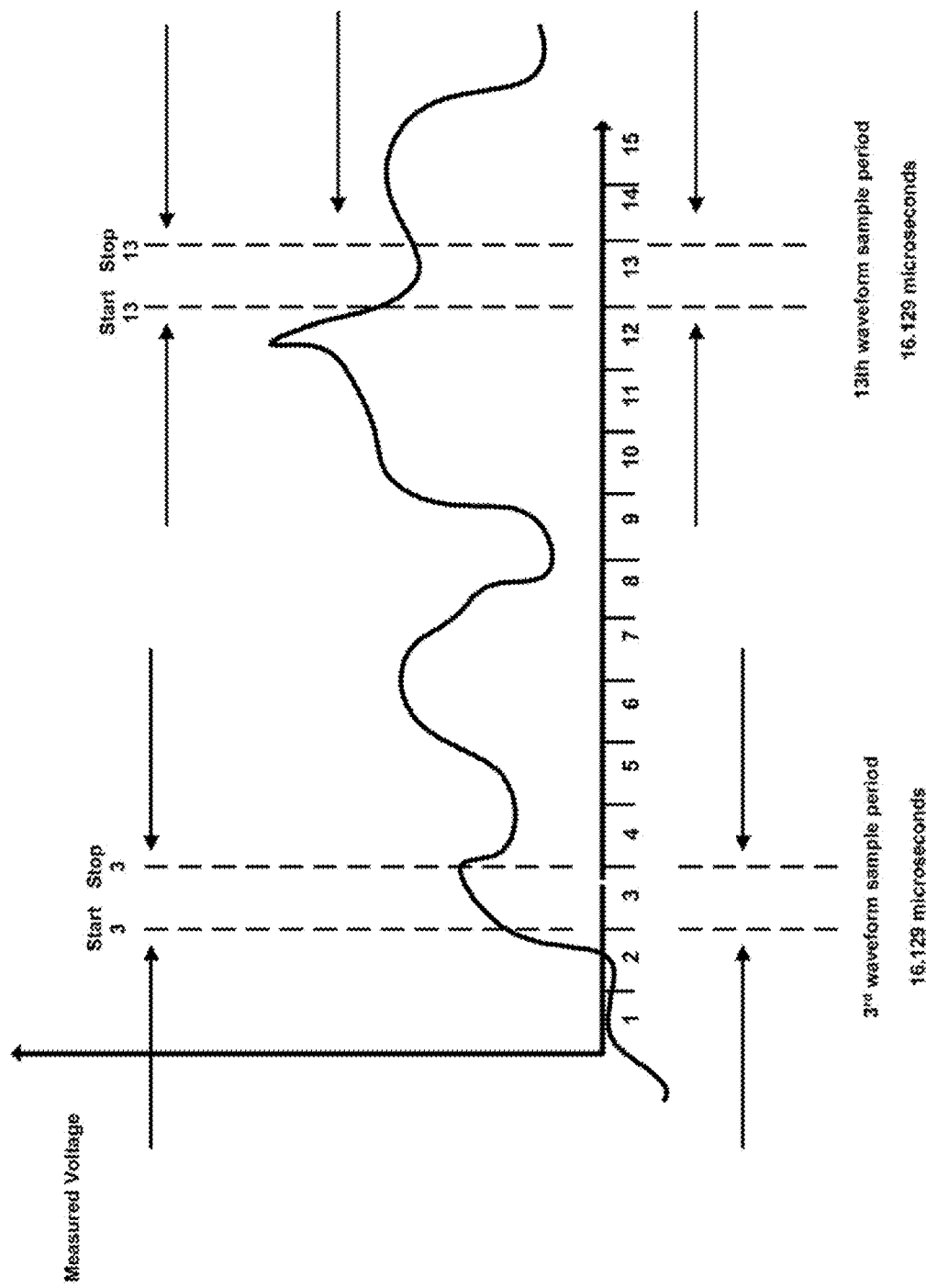
FIG. 3b illustrates an exemplary sampled waveform processed in accordance with waveform sample periods, according to one embodiment.

With continued reference to FIG. 3b, a graph of voltage (e.g., Va) vs. time is shown whereby the time axis is divided in accordance with equidistant waveform sample periods. The waveform sample periods correspond to the system clock frequency, which in a preferred embodiment is 61.44 KHz. It should be understood, however, that 61.44 KHz is insufficient to detect transients which may occur in the sampled voltage (e.g., Va). Thus, a higher transient sampling rate is required, which is typically orders of magnitude higher than the system clock frequency of 61.44 KHz. In one embodiment, the high bandwidth transient capture A/D converter circuit 7 operates at or above 50 MHz to be able to capture transients as they occur in the sampled waveforms.

As shown in FIG. 3b, each waveform sample period is defined by a start and stop boundary. For example, waveform sample period 3 is defined by start boundary 3 and stop boundary 3. These boundaries define initialization and reset periods, respectively, for detecting transient information including peak and duration information, for example. In other words, each waveform sample period defines the boundaries of a new transient capture cycle.

Referring again to FIG. 3a, the high bandwidth transient capture A/D converter circuit 7 samples the four input analog voltage channels Va, Vb, Vc and Vn and outputs digital samples of voltage transients 30 from the respective voltage channels to a field programmable gate array (FPGA) 80.

In one embodiment, the transient capture A/D converter 7 may be implemented as an ADC08L060 which is a low power, 8 bit, 10 MHz to 60 MHz A/D converter. It is understood that the IED 10 of the present disclosure is not limited to any particular component for performing A/D conversion. The ADC08L060 represents one example of an A/D component suitable for use with the present invention. The ADC08L060 is commercially available from National Semiconductor, Santa Clara, Calif.

FPGA 80 supports digital sampling in excess of 100 MHz. Threshold voltage levels for use as one input to a comparator for determining the presence or absence of a transient are communicated from the CPU 50 to the FPGA via a Host bus 51. In another embodiment, DSP Post Processor 112 provides the threshold voltage levels.

The FPGA 80 includes a transient and waveform controller, identifiable in FIG. 3a as transient detect controller 114 for controlling the sampling of both the waveform data 32 by the waveform capture A/D's 8A and the sampling of the transient 30 by the transient capture A/D's 7. The Transient detect controller 114 is described in more detail below.

With continued reference to FIG. 3a, the FPGA 80 is shown to receive digital samples 30 of the voltage transients in real-time output from the transient capture A/D converter 7. Based upon the voltage thresholds set by the CPU 50, the FPGA 80 identifies and stores a single peak transient value along with its associated duration during each waveform sample period of the IED 10. At the end of each waveform sample period, the single peak transient value and its associated duration are passed to the DSP Post Processor 112 on transient and waveform data bus 113 in parallel along with waveform data 32 transferred to FPGA 80 from the waveform capture A/Ds 8A under control of the waveform capture control 122 of FPGA 80.

The DSP Post Processor 112 correlates the received peak transient value and associated duration (referred to hereafter as transient data) to the lower bandwidth sampled waveform data 32 and replaces the received waveform data 32 with the corresponding transient data to produce merged waveform data. The DSP Post Processor 112 also retains a copy of the unmerged lower bandwidth sampled waveform data 32 and transient data). The merged waveform data is then passed to the CPU 50 by DSP Post Processor 112 via a dual port memory 118 in the FPGA 80. The CPU 50 stores the merged waveform and makes it available for presentation to the user.

It is appreciated that the CPU 50 also has access to the unmerged waveform data 32 and transient data via the DSP Post Processor 112.

In an embodiment, FPGA 80 can be configured to capture complete transient waveforms in its transient capture internal memory 116 or external memory 110 for large transient captures. In such an embodiment, the process is controlled by the transient detect controller 114 which is fully configurable. It is appreciated that in the presently described embodiment, the functionality of the transient detect controller 114 is designed into the FPGA 80.

In operation, to capture complete transient waveforms, transient samples are captured to the transient capture internal memory 116 or transient capture external memory 110 whenever a transient rises above the transient threshold. At the end of a waveform sample period, the transient capture internal memory 116 or external memory 110 effectively stores a snapshot of a complete transient waveform. It is appreciated that a complete transient waveform comprises an array of (x,y) pairs denoting amplitude and time from the point in time that a transient rises above the transient threshold to the point in time that the same transient falls below the same threshold. The Transient Capture Memory data for a given waveform sample period can be read by CPU 50 via Host Bus 51 and stored in a transient snapshot log.

IV—Absolute Value Transient Detect Controller Embodiment

Figure 4A:
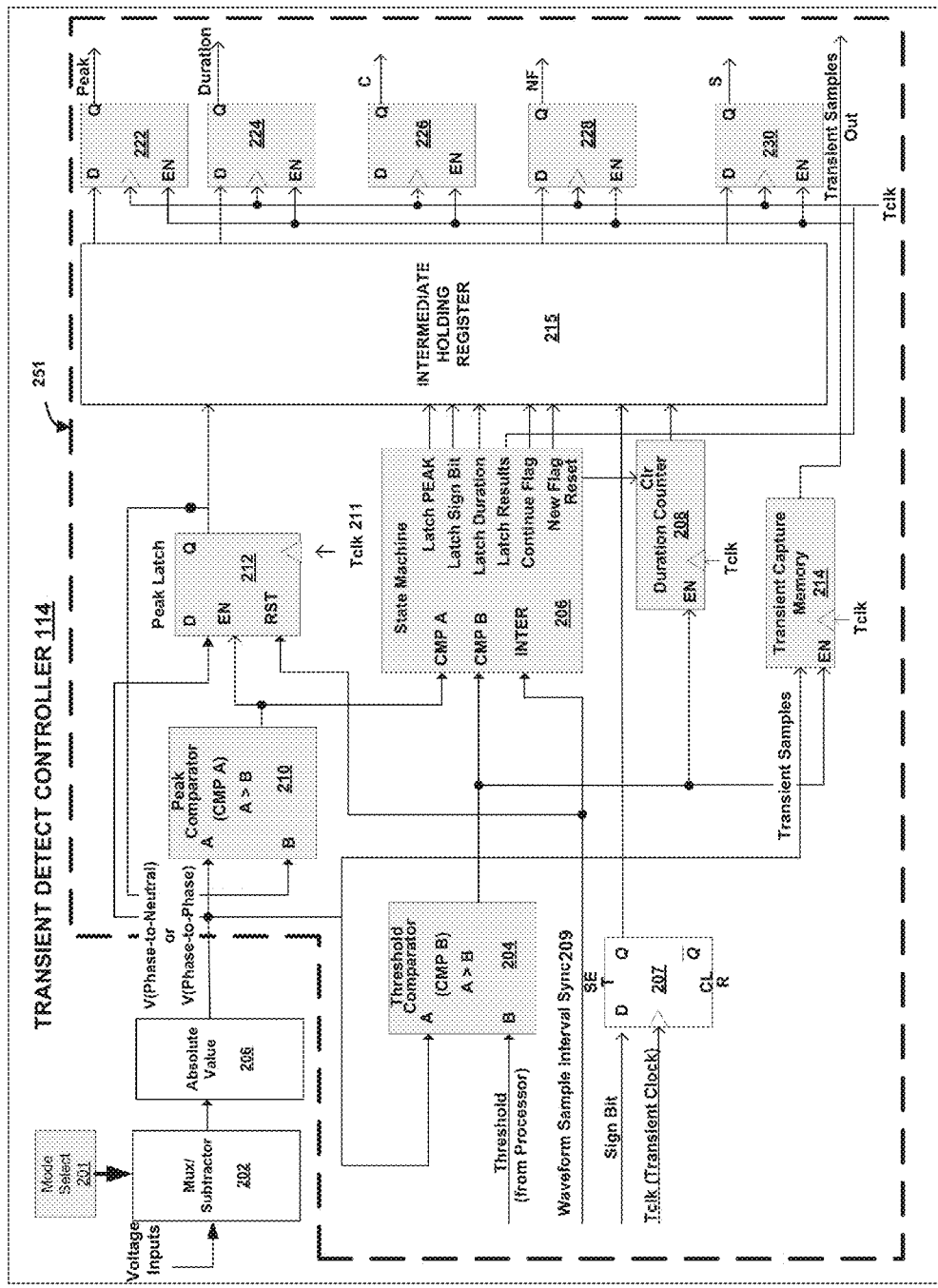
FIG. 4a is a hardware configuration of a transient detector of the FPGA, according to one embodiment.

Referring now to FIG. 4a, there is shown a more detailed block diagram of the transient detect controller 114 of FIG. 3a, according to one embodiment. In the embodiment shown in FIG. 4a, both negative and positive transient samples received from mux/subtractor 202 are converted to their absolute value before any other processing occurs. More specifically, the absolute value module 206 converts both the negative and positive transient samples output from the mux/subtractor 202. Consequently, the Absolute value module 206 outputs only positively signed transients to threshold comparator 204 (CMP B), peak comparator 210, and peak latch 212. This allows the peak comparator 210 to find the largest transient irrespective of whether the transient was a negative or positive peak. The sign of the transient sample is also stored as a flag as additional information to indicate if the sample was positive or negative. The absolute value and associated sign information is then passed to DSP Processor 70 so that the originally detected transient characteristics (e.g., sign and magnitude) can be restored.

In the presently described embodiment, the FPGA 80 is configured via firmware to provide the various transient detector functions detailed below.

Multiplexer/Subtractor Circuit 202

As shown in FIG. 4a, the transient detect controller 114 of the FPGA 80 includes in one embodiment a multiplexer/subtractor circuit 202 (mux./subtractor). The mux/subtractor 202 accepts the digital samples of the voltage transients in real-time from the A/D converter 7 and determines either phase to phase voltages or phase to neutral voltages. A mode select 201 is provided to the mux/subtractor 201 to receive a signal from the CPU 50 (or at least one DSP Processor) to select the mode in which the mux/subtractor 202 will operate. There are three modes of operation. The first mode determines whether the transient detect controller is on or off. The second or third modes can be selected only when the first mode is set to the "on" state. The second mode determines phase to neutral voltage. The third mode determines phase to phase voltage. These modes are firmware implemented in the FPGA 80. The Mode register controls the state of a multiplexer so that the subtractor is either always subtracting the neutral phase from the other phases to create phase-to-neutral channels or selects another phase to create phase-to-phase transient channels.

Comparator 204

With continued reference to FIG. 4a, the transient detect controller 114 of the FPGA 80 further includes a threshold comparator 204 (CMP B) which detects if a transient is above a threshold set by the CPU 50. In other embodiments, the threshold can be set instead by at least one DSP Processor 70.

State Machine 206

A state machine is any device that stores the status of something at a given time and can operate on input to change the status and/or cause an action or output to take place for any given change. The transient detect controller 114 includes a single state machine 206, as shown in FIG. 4a. The state machine 206 controls the process of selecting peak values of transients and a second state machine controls the transfer of the peak transient sample captured to at least one DSP Processor 70.

I. States of State Machine 206

State (0)—corresponds to a state where a transient is determined to be above a positive voltage threshold and a peak for the first transient during the present waveform sample period has occurred. The positive voltage threshold is communicated from the CPU 50 to the FPGA 80 via a Host bus 51 (see FIG. 3a).

State (1)—corresponds to a state where the transient is determined to be below the positive threshold and not at a waveform sample boundary.

State (2)—corresponds to a state where a second transient occurred during a waveform sample period which has a higher peak value than the first that was captured during the same waveform sample period which were above the positive threshold and not at a waveform sample boundary.

State (3)—corresponds to a state where the transient was determined to be above the positive threshold but below a previously captured transient peak and not at a waveform sample boundary.

State (4)—corresponds to a state where the transient is determined to be below the positive threshold and a waveform sample boundary.

State (5)—corresponds to a state where the transient continues above the positive threshold at the waveform sample boundary.

Duration Counter 208

The transient detect controller 114 of the FPGA 80 includes a duration counter 208. The threshold comparator 204 (CMP B) enables the duration counter 208 whenever a transient goes above the threshold set by the CPU 50 (or the DSP Processor 70). The duration counter 208 remains enabled as long as the transient is above the threshold so that the transient duration within a waveform sample period can be measured. The state machine 206 clears the duration counter 208 at the start of each waveform sample period then whenever a transient exceeds the threshold level during a waveform sample period, the duration counter 208 is incremented at the transient sampling rate of 50 MHz. Coincident with the start of the peak detect circuitry, the output of threshold comparator 204 (CMP B) is used to enable the duration counter 208 to measure the duration of the transient. The measured transient duration value is passed on to the DSP Processor 70 along with the associated transient peak value.

Peak Comparator 210

The peak comparator 210 (CMP A) detects the peak value Pa of a transient that may occur during a waveform sample period. As shown in FIG. 4a, the incoming transient sample is routed to the A input of the Peak Comparator 210 (CMP A), where it is compared to a previously latched peak transient sample. If the incoming transient sample is greater than the previously latched peak transient sample it enables the peak latch 212 which outputs the signal at output Q of peak latch 212 and feeds it back to the B input of the peak comparator 210 (CMP A) for comparison with the next incoming transient sample.

Transient Clock 211

The transient clock (Tclk) 211 of the peak latch 212 is a high speed clock that is programmed by the FPGA 80 to clock the peak latch. By way of example, the peak latch can be clocked at a rate of 50 MHz.

Transient Capture Memory 214

With continued reference to FIG. 4a, the Transient detect controller 114 further includes a transient capture memory 214. The transient capture memory 214 can be internal or external to the FPGA 80 in different embodiments. All transient samples above the threshold are stored in the transient capture memory 214 under control of the FPGA 80. As previously noted, in other embodiments, the same process may be performed under control of the DSP processor 70 or the CPU 50. Digital transient samples are written to the transient capture memory 214 from the beginning of a waveform sample period. If at the end of a given waveform sample period, it is determined that no transients occurred, the transient detect controller (TDC) 114 resets the write memory counter causing the data captured during the given waveform sample period, which did not contain a transient, to be overwritten. In a given waveform sample period, if a transient is detected, the TDC 114 continues to capture transient samples whether they are above or below the threshold until the memory in use is full. In another words whenever a transient is detected a snapshot of the transient event and what occurred around the transient event is captured for presentation to an end user.

In operation, the transient detect controller (TDC) 114 monitors the state of the Transient Capture Memory 214 and when it is full sets a flag to CPU 50 to inform CPU 50 that the transient sample may be read from the transient capture memory 214 for presentation to an end user. After reading the transient sample data from the transient capture memory 214, CPU 50 sets a flag to the TDC 114 to indicate that the memory is available for another capture. TDC 114 also sets a flag to DSP 70 when data is first written to memory so that the DSP 70 can record a time stamp of the waveform sample time when the memory capture of the transient began. DSP 70 passes the time stamp to CPU 50 so it can co-ordinate in time the presentation of the transient waveform image with other waveform and peak transient data.

Intermediate Holding Register 215

The intermediate holding register 215 is a temporary holding buffer for storing various values collected during each waveform sample period. In one embodiment, these values include (1) a peak value received from peak latch 212, determined to be the highest peak value in the present waveform sample period, (2) a duration value received from duration counter 208, determined to be the associated duration of the peak value stored in peak latch 212, (3) a continue flag ("c") value received from state machine 206, (4) an New flag "NF" value received from state machine 206, and (5) a sign ("s") value received from latch 207, for determining whether the peak value is positive (s=0) or negative (s=1).

V—Operation of the Transient Waveform Detection System

At the start of each waveform sample period (see FIG. 3b), the FPGA 80 generates a Waveform Sync 209 signal that the state machine 206 uses to reset the peak latch 212 and the duration counter 208 for the beginning of a new transient capture cycle.

In each waveform sample period, the state machine 206 monitors the outputs of peak comparator 210 and threshold comparator 204 (CMP B) to detect when a transient has exceeded the set threshold and when it has fallen below the set threshold so that it can detect if transients may have occurred during the current waveform sample period. The state machine can also identify if a transient persists over more than one waveform sample period. If a detected transient is above the threshold, the threshold comparator 204 (CMP B) triggers, via the state machine 206, the start of the peak detect circuitry. The peak detect circuitry includes a peak comparator 210 (CMP A), a peak latch 212 and a duration counter 208 along with the transient waveform capture circuitry 7 (See FIG. 1), as described above, which is performed at a transient sampling rate of at least 50 MHz.

The transient detect controller 114 and specifically state machine 206 has several outputs to control the acquisition of transient data including: Latch peak which is a signal which latches the peak value of the present transient in the intermediate holding register 215 after the transient has dropped below the threshold or at the end of a waveform sample waveform sample period, Latch sign Bit and Latch duration are signals which latch the sign and duration in the intermediate holding register 215 at the same time that the peak value of the transient is latched there. Latch results, Continue Flag and New Flag, Reset are signals generated at the end of the waveform sample period. Latch results, latches the final results which have been temporarily stored in the intermediate hold register 215. At the same time the signal Continue Flag indicates that the transient is still above threshold when crossing into the next waveform sample period so that the total duration of the transient can be calculated. New Flag is set if a new transient occurred in the cycle. The New Flag indicates to the firmware that if Continue Flag was set previously that the peak and duration stored at the end of the next cycle is from a new transient and not part of the continuation of the transient that started in the previous cycle. This supports that the largest transient is found and that the durations are not associated with the wrong transient. For a better understanding see the examples below. The Reset signal is used to clear the counters and registers at the appropriate time in preparation for the next transient capture. These values are initialized to low (e.g., 0) at the beginning of each waveform sample period and set high (e.g., 1) by the state machine upon the detection of the appropriate condition.

Whenever a transient is detected, the duration counter 208 is started. As the transient falls below the predetermined threshold, the state machine 206 transfers the duration counter 208 value to the intermediate holding register 215 and resets the duration counter to zero in preparation for the next transient occurrence. At the point in time that the detected transient falls below the predetermined threshold, the duration counter is disabled from counting due to the change in state of the comparator (CMP B). At this point in time, the state machine 206 stores the duration counter 208 value which was measured while the transient was occurring by generating the Latch Duration signal output which latches the duration counter value in a temporary holding buffer, i.e., intermediate holding register 215. If a larger transient is detected during the same waveform sample period its peak and duration will be overwritten by state machine 206 in the intermediate holding register 215 in accordance with the described process. The state machine 206 resets the duration counter 208, via the Reset signal output, to the CLR input of duration counter 208 in preparation for a new transient.

In a given waveform sample period, if a transient with a larger peak value than the currently detected peak value does not occur, the state machine 206 latches the duration stored in the intermediate holding register 215 with the Results Latch signal output of state machine 206 to a final result Duration Results Latch. Otherwise, if a transient having a larger peak value does occur within a given waveform sample period, the new larger transient peak value and its associated duration value will overwrite the previous transient duration value stored in the intermediate holding register 215 under control of state machine 206 and at the end of the current waveform sample period state machine 206 stores the intermediate holding register 215 duration value to a final result duration latch 224 by outputting the Results Latch signal which is also used to latch the peak value and associated flags into result latches.

It is appreciated that, in the special case where a transient is above the set threshold at the waveform sample boundary the state machine 206 also sets the "C" flag and writes it to a Results Latch so that the DSP Processor 70 can combine durations and compute the total duration and peak value if it is sustained over multiple waveform sample periods.

The state machine 206 of the transient detect controller 114 includes a Result Latches. The Result Latches hold the peak and duration transient values along with flags to indicate continuation across a waveform sample boundary, sign of the transient whether it was positive or negative and a New flag to indicate if a new transient had occurred (NF=1) or was the signal above the threshold for the entire waveform sample waveform sample period (NF=0). The latched results are then transferred over a dedicated transient and waveform data bus to the DSP Processor 70 for further processing.

VI—Multiple Path Transient Detect Controller Embodiment

Figure 4B:
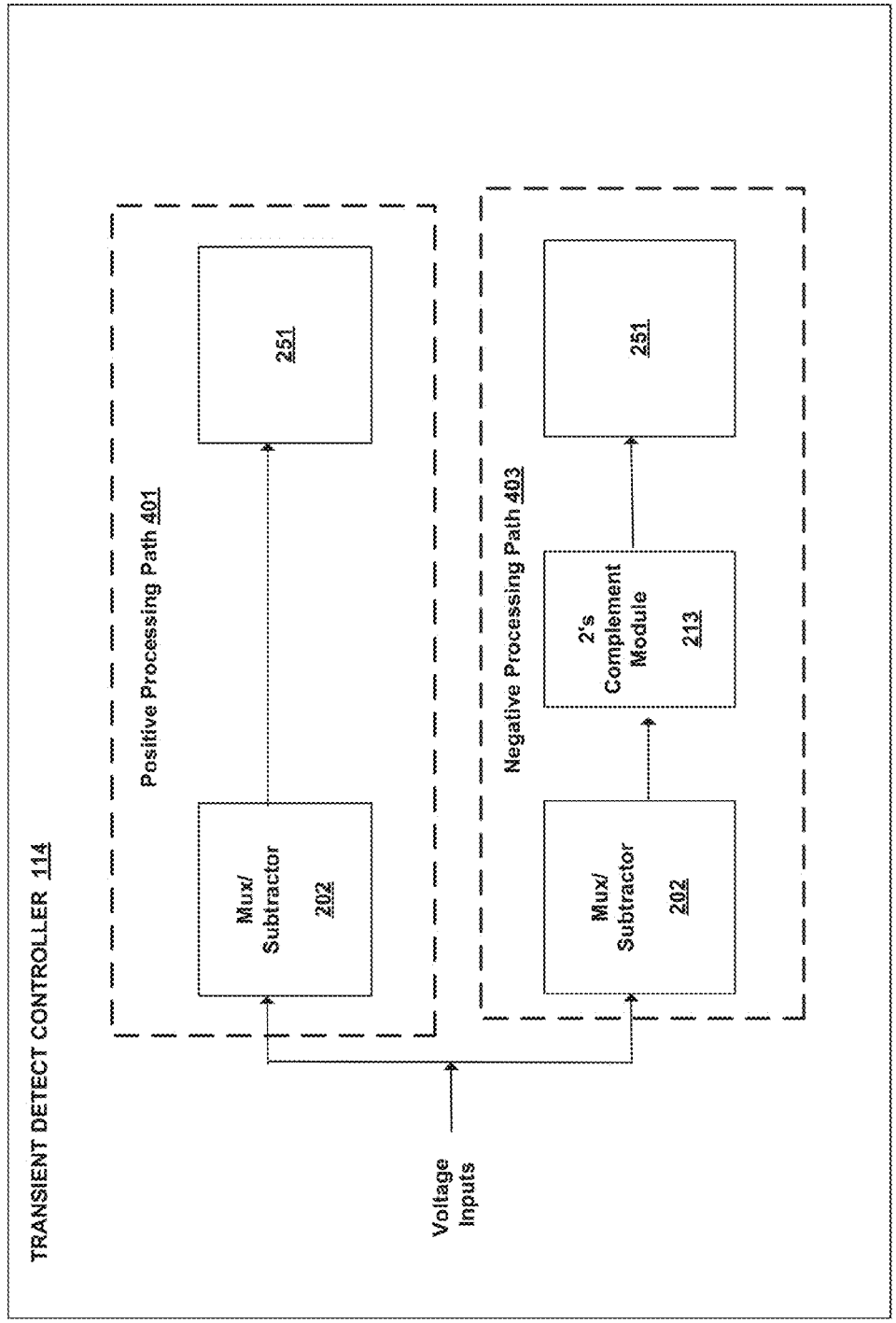
FIG. 4b is a hardware configuration of a transient detector of the FPGA, according to another embodiment.

Referring now to FIG. 4b, there is shown another emodiment of the transient detect controller 114 of FIG. 3a. In the embodiment shown in FIG. 4b, positive transient samples are processed in a first processing path 401 and negative transient samples are processed in a separate second processing path 403.

Referring first to the positive processing path 401, the transient samples are output directly from mux/subtractor 202 to block 251 which describes elements of the transient detect controller 114 shown in FIG. 4a. It should be understood that in the present embodiment, block 251 operates in the identical manner described above, as shown in FIG. 4a.

Referring now to the negative processing path 403, the transient samples are output directly from mux/subtractor 202 to 2's complement module 213. The 2's complement module 213 is configured to convert negative transient samples to positively signed transient samples to allow block 251 to process the negative transients in the manner described above. Conversely, positive transients are converted to negatively signed transients and are discarded in the negative processing path 403. That is, the negatively signed transients will be below the threshold set in the threshold comparator 204 and are consequently discarded (i.e., not recognized as transients).

It should be understood that both the negative and positive transient processing paths 401, 403 operate in parallel so that if both large positive and large negative transients occur, both will be captured and transferred to CPU 50 via one of the four high speed serial channels that go between FPGA 80 and CPU 50.

VII—Examples of Waveform Samples and States of the State Machine

Illustrative, non-limiting examples of waveform samples and the various states of the state machine 206 are described in conjunction with FIGS. 5 and 6(a)-6(f).

Figure 5:
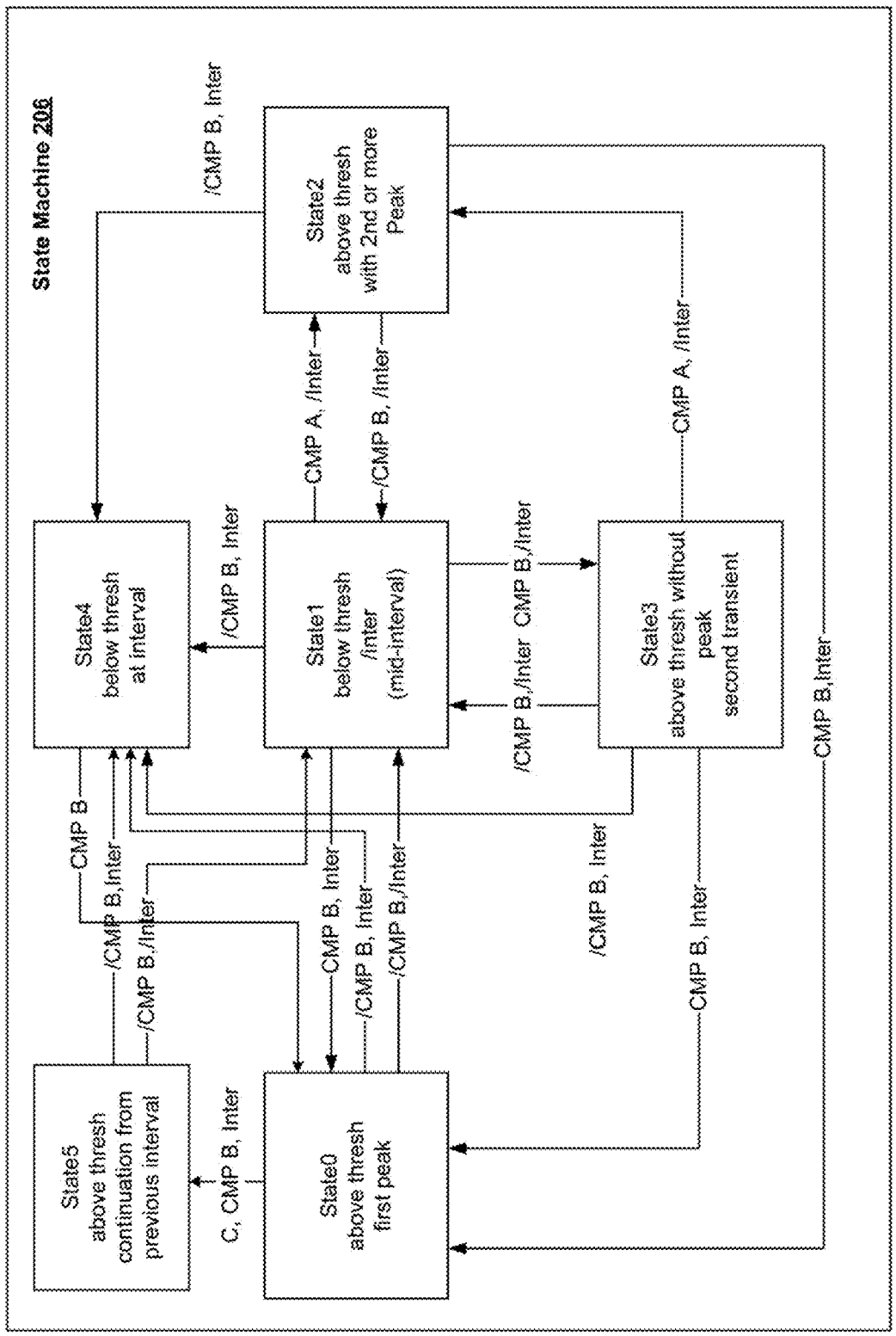
FIG. 5 illustrates the operation of the transient detector and in particular the state machine's different states based upon the transient samples and threshold levels received by the IED.

FIG. 5 illustrates the operation of a state machine 206 incorporated into transient detect controller. In particular, FIG. 5 illustrates the state machine's 206 different states based upon the transient samples and threshold levels received by the IED 10.

FIGS. 6(a)-6(f) provide illustrative non-limiting examples of various waveform samples including transients to illustrate how the state machine 206 of the IED 10 of the present disclosure operates to detect and save the transient information.

Prior to discussing the figures, the following definitions are provided. A "transient" is defined as a waveform that crosses a positive voltage threshold for some period of time and then transitions below the positive voltage at a later point in time. Input "CMP A": refers to a new peak for a transient waveform sample. Input "CMP B": refers to the transient waveform sample being above the positive threshold level.

I. First Example

Figure 6A:
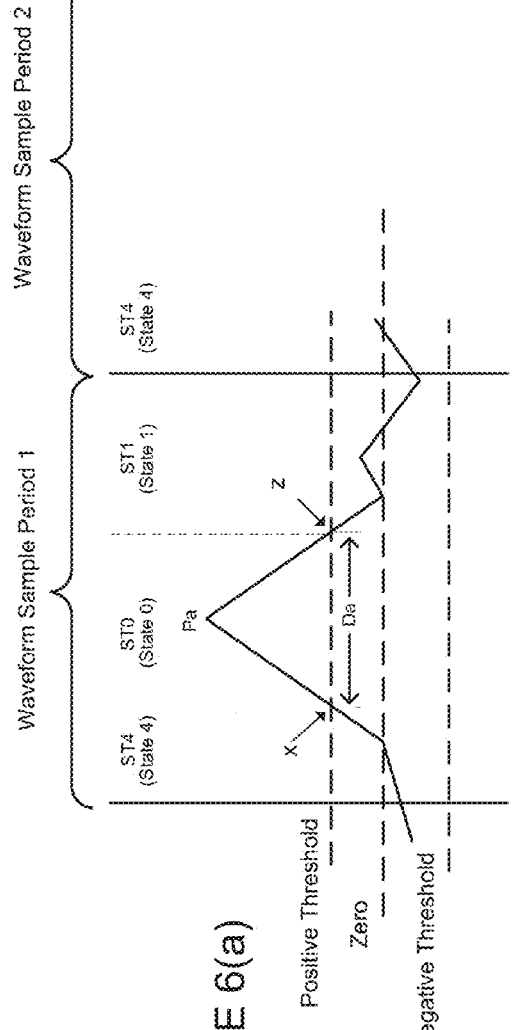

FIG. 6(a) shows a first example of a transient waveform sample, discussed in the context of the various states of the state diagram of state machine 206, as illustrated in FIG. 5. As shown in FIG. 6(a), the transient waveform at the initial (left hand) boundary of waveform sample period 1, is shown to be below the positive voltage threshold level for at least one previous waveform sample period, and above the negative voltage threshold level, causing the state machine to start out in state 4. Recall from above that reflects State (4) corresponds to a state where the transient is determined to be below the positive threshold and at a waveform sample boundary. The transient waveform is then shown to rise until it is crosses the positive threshold at point "x". At this point the threshold comparator CMP (B) 204 output is true causing the state machine 206 to transition from state (4) to state (0). Recall that state (0) corresponds to a state where a transient is determined to be above a positive voltage threshold and a peak for the first transient during the present waveform sample period has occurred. In this case, the peak is determined to be the first transient sample (i.e., peak value) upon crossing the positive threshold. The first transient sample (i.e., peak value) is stored in peak latch 212.

Continuing with the present example, while the state machine 206 is in State (0), the transient waveform value, in waveform sample period 1, continues to rise until it reaches peak value Pa, as shown in FIG. 6(a). It is noted that while the state machine 206 is in State (0), the state machine 206 continuously obtains and saves ordinate values of the transient to peak latch 212 (see FIG. 4a) and compares the most recently received ordinate value with the most recently saved peak value, currently stored in peak latch 212. Whenever an ordinate value is determined to be higher than the currently saved peak value in peak latch 212, the, ordinate value replaces the currently saved value in the peak latch 212. At the end of waveform sample period 1, the transient value stored in the Peak latch 212 is transferred to the intermediate holding register 215 (see FIG. 4a). This value is considered to be the peak value for waveform sample period 1.

It should be appreciated that in contrast to conventional transient waveform detection systems, the transient waveform detection system of the present disclsoure records both the peak values of the transient waveform in addition to the duration of the entire transient. Duration is defined herein from the point in time a transient crosses above the positive threshold to the point in time the transient falls below the same positive threshold. For example, in FIG. 6(a), the transient duration for the transient having a peak value Pa, is labeled "Da". Transient duration is measured by the duration counter 208, as shown in FIG. 4a.

As the transient transitions below the positive threshold, at point "z", the state machine 206 correspondingly transitions from state (0) to state (1). Recall from above that State (1) defines a state where the transient is determined to be below the positive threshold and not at a waveform sample period boundary. In other words, the transient is somewhere between the left and right vertical boundary lines defining waveform sample period 1. The transient is shown to remain in State (1) until the end of waveform sample period 1.

At point "z", the point in time at which the state machine 206 transitions from State (0) to State (1), the state machine 206 transfers the value stored in peak latch 212 to the intermediate holding register 215. The value stored in the intermediate holding register 215 is transferred to results latches 222, 224, 226, 228 and 230 at the end of waveform sample period 1 as a final peak value (i.e., determined to be the highest peak value in the present waveform sample period, e.g., period 1).

Continuing with the instant example of FIG. 6(a), The outputs of the transient detect controller 114 output a number of values at the end of the waveform sample period. These values include: the peak latch 222 having a value Pa (the highest peak value in the present waveform sample period), the duration latch 224 having a value Da (the duration associated with the value Pa), the sign latch 230 having a value of zero (0) since there was a positive peak transient value, the C (continue latch) 226 having a value of zero (0) since the peak transient did not continue through to the next waveform sample period (waveform sample period number 2) and the NF latch (new transient latch) 228 having a value of 1 since there was only one peak transient, Pa, during that waveform sample period for that transient.

II. Second Example

Figure 6B:
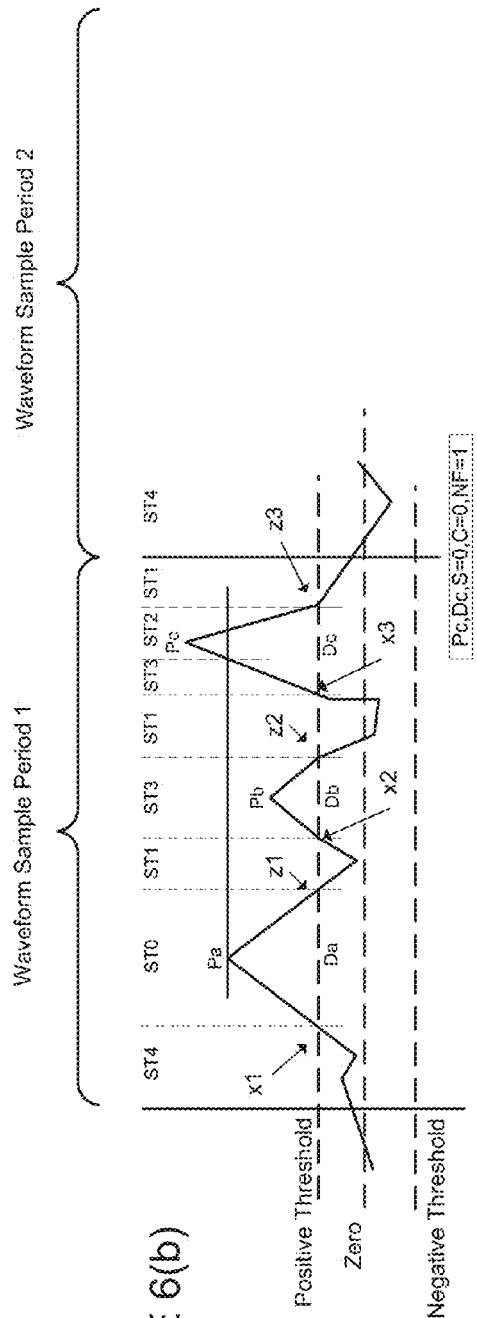

FIG. 6(b) illustrates a second non —limiting illustrative example of how the transient waveform detection system operates on an exemplary transient waveform. In the present illustrative example, there are shown three peak values having magnitudes of of Pa, Pb, and Pc, respectively. Each peak value has a respective associated duration of Da, Db and Dc.

With continued reference to FIG. 6(b), the first transient initially rises above 0 volts in waveform sample period 1 and continues to rise but remains below the positive threshold level as it drops slightly. Since this spike is below the positive threshold and above the negative threshold, the state machine 206 recognizes that this is not a peak transient and consequently enters into State (4) at the left boundary of waveform sample period 1, indicating that the transient is below the positive threshold.

The transient then rises above the positive threshold at point "x1" to eventually reach a peak value of Pa. This first transient peak, waveform sample period Pa, is shown to have has an associated duration of Da. At point x1, the state machine 206 enters into State (0). At a later point in time, point "z1" the transient drops below the positive threshold causing the state machine to transition from State (0) into State (1).

While in State (1) the transient falls and then rises again until it is crosses the positive threshold for the second time in waveform sample period 1 at point "x2". At this point in time the state machine 206 transitions from State (1) into State (3). The state machine 206 enters State (3) as the transient is determined to above the positive threshold without reaching a highest determined peak value for waveform sample period 1, since the peak value for this transient Pb is less than that of the previously determined peak transient value Pa. In this case, the transient value Pb is not saved by the state machine 206.

Continuing with the instant example, the transient then drops until it falls below the positive threshold at point "z2". At this point the state machine 206 transitions from State (3) to State (1). While in State (1), the transient then rises above the positive threshold for the third time in waveform sample period 1 at point "x3", with the state machine 206 transitioning back from State (1) to State (3).

While in State (3), the transient eventually exceeds the previously highest recorded peak value Pa for the waveform sample period 1, the state machine 206 then transitions from State (3) to State (2). The state machine 206 remains in State (2) since the transient level is determined to be below the peak value Pa of the last saved transient for this transient and the waveform sample boundary has not been reached.

At the point in time that the transient rises above the previously highest recorded peak value Pa, the state machine 206 recognizes and saves the new peak value Pc and replaces the old transient peak value Pa and its associated duration Da with the new transient peak value Pc and its associated duration Dc. The transient then drops below the positive threshold at point "z3" at which time the peak duration Dc ends and the state machine 206 transitions from State (2) to State (1) until the point in time that the transient passes the waveform sample period boundary line for waveform sample period 1, at which point the state machine transitions from State (1) to State (4).

In the example of FIG. 6(b) the latch values for the transient detect controller 114 are: the peak latch 222 has a value of Pc, the duration latch 224 has a value of Dc, S=0, C=0 and N=1 since there was a new transient Pc.

III. Third Example

Figure 6C:
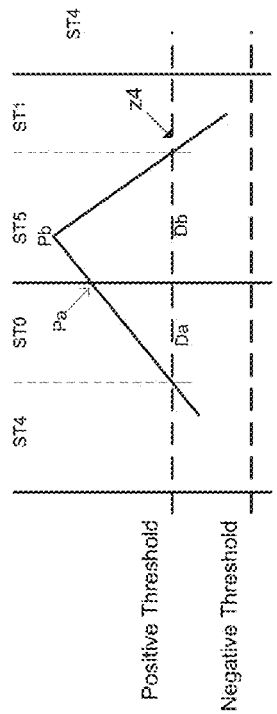

FIG. 6(c) illustrates an example of when a transient continues over multiple waveform sample periods (i.e., waveform sample periods 1 and 2) and how the state machine 206 is able to recognize and store this information.

In FIG. 6(c), the transient is initially shown to be below the positive threshold. The state machine 206 enters into State (4) whenever this occurs. The transient then rises above the positive threshold with the state machine 206 entering State (0) and reaching its peak value Pa at the end of the waveform sample period 1. The duration for transient Pa is shown to be Da. The latch values 222, 224, 226, 228, 230 of the transient detect controller 114 at the end of waveform sample period 1 are: peak transient=Pa, peak transient duration=Da, S=0, C=1 and NF=1. Latch value C=1 because the transient persists across the waveform sample period boundary from period 1 to 2 and remains above the positive threshold.

At the beginning of waveform sample period 2, the state machine enters into State (5) and the transient reaches a peak value of Pb and has a duration Db. State (5) indicates that the transient is a continuation from the previous waveform sample period, i.e., waveform sample period 1. The latch values 222, 224, 226, 228, 230 output from the transient detect controller 114 at the end of waveform sample period 2 are: Pb, Db, S=0, C=0 (i.e., the transient no longer continues at the end of this second waveform sample period, but drops below the positive threshold), NF=0 (the transient is not a new transient in the second waveform sample period, rather, it is the same transient from the immediately preceding waveform sample period).

Based on the latch values, the transient waveform detection system recognizes that the transient has crossed a waveform sample period boundary. DSP 70 uses this information and can therefore correctly determine the true peak value, e.g. highest value, for this transient which in this case is Pb and will recognize it as the final value. DSP 70 also can recognize that the total duration of the transient, is the sum of the respective durations Da and Db, i.e., the two separate durations for each of the respective peak values Pa and Pb. Thus, the transient waveform detection system is capable of reporting the true peak value Pb for this transient and its associated duration, which is the sum of (Da+Db).

Continuing with the instant example, the transient in FIG. 6(c) then drops below the positive threshold at point "z4" and the state machine 206 transitions from State (5) to State (1). At the end of waveform sample period 2, the state machine 206 transitions from State (1) to State (4).

IV. Fourth Example

Figure 6D:
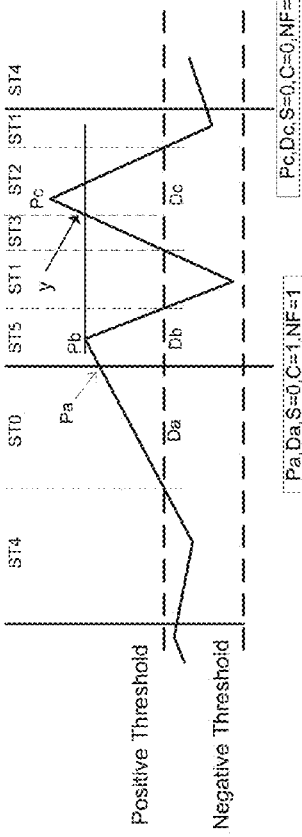

FIG. 6(d) illustrates an example of a transient that extends over from a first to a second waveform sample period and additionally, a second transient is detected in the second waveform sample period.

In FIG. 6(d), the transient is initially below the positive threshold and in State (4). The transient then rises above the positive threshold with the state machine 206 transitioning from State (4) to State (0) where it reaches a peak transient level Pa, with an associated duration of Da, at the end of waveform sample period 1.

In the second waveform sample period 2, the transient continues to rise to a new peak value Pb, with an associated duration of Db. Note that peak value Pb is greater than peak value Pa. At the end of the first waveform sample period, latch values of the transient detect controller 114 are: highest peak value Pa, associated duration=Da, S=0, C=1 (because the transient continues into the next waveform sample period) and NF=1 (because the transient is new transient arising for the first time in the first waveform sample period.

During the second waveform sample period, the transient is initially in State (5). While in State (5), the transient drops below the positive threshold indicating the end of transient duration Db with the state machine 206 transitioning from State (5) to State (1). The transient then rises above the positive threshold but remains below the previously recorded peak value Pb with the state machine 206 transitioning from State (1) to State (3). The transient continues to rises and is above the positive threshold and at point "y" rises above the previous peak value Pb, at which point the state machine 206 recognizes a new transient having a value of Pc and a duration Dc with the state machine 206 transitioning from State (3) to State (2).

Thereafter, as the transient falls below the positive threshold the state machine 206 transitions from State (2) to State (1). At the end of the second waveform sample period, the latch values for the state machine are Pc, Dc, S=0, C=0, NF=1. A value of C=0 indicates that that the transient does not continue into the next waveform sample period. A value of NF=1 indicates that the transient Pc is a new transient and not a continuation of a transient from the previous waveform sample interval 1. The latch values indicate to the transient waveform detection system that during the second waveform sample period there were there were at least two transients, the first transient being a continuation from the immediately preceding waveform sample period, i.e., waveform sample period 1, and a second transient Pc, having an associated duration value of Dc, being a new transient having a higher peak value than the first transient detected peak transient Pb.

V. Fifth Example

In the transient of FIG. 6(*e*), five waveform sample periods waveform sample period are discussed.

V. 1—Waveform Sample Period 1

In the first waveform sample period 1, the state machine transitions from State (4) to State (0) reaching peak value Pa with an associated duration Da at the end of waveform sample period 1. Latch values at the end of waveform sample period 1 which are output from the transient detect controller 114 are peak transient=Pa, associated duration=Da, S=0, C=1 (the transient continues into the next waveform sample period), and NF=1 (the transient is a new transient in waveform sample period 1 and not a carryover from a previous waveform sample period).

V.2—Waveform Sample Period 2

In the second waveform sample period, the transient continues to rise reaching a peak value of Pb that is higher than peak value Pa of the immediately preceding waveform sample period 1. The peak value Pb has an associated duration of Db. The latch values for the transient detect controller 114 at the end of waveform sample period 2 are: Pb, Db, S=0, C=1 (the transient is a continuation from the previous waveform sample period 1) and NF=0 (the transient is not a new transient in waveform sample period 2 but is instead a continuation of a transient from the immediately preceding waveform sample period 1).

In this second waveform sample period, the transient has a new peak transient value Pb with a corresponding duration value of Db. It is shown that the transient from peak value Pa in the first waveform sample period through peak value Pb in the second waveform sample period does not fall below the positive threshold. As such, the transient waveform detection system recognizes this as being the same transient and sets the C flag (i.e., the continuation flag) so that DSP 70 processes the transient as one long transient, determines the largest peak and sums the respective durations Da and Db.

V.3—Waveform Sample Period 3

In the third waveform sample period, the transient reaches a new peak value Pc which is shown to be greater than Pb.

The state machine 206 remains in State (5) because the new peak value Pc is above the positive threshold and the transient is a continuation from the immediately preceding waveform sample period. Recall from above that State (5) corresponds to a state where the transient continues above the positive threshold at the waveform sample boundary.

As shown in waveform sample period 3, the transient steadily declines but remains above the positive threshold at the waveform sample period 3 boundary. In this case, at the beginning of the fourth waveform sample period a peak value Pd is saved (i.e., the boundary value). The duration of transient peak value Pc is Dc. At the end of the third waveform sample period, the latch values output from the Transient detect controller 114 are: Pc, Dc, S=O, C=1 and NF=0 (the transient is not new but a continuation from the last waveform sample period 2).

It is recognized that the transient of the third waveform sample period has not gone below the positive threshold from having crossed it in the first waveform sample period. Accordingly, the transient waveform detection system recognizes the transient of the third waveform sample period as being the same transient from the first waveform sample period. The transient is monitored to determine a highest peak value to replace the previous peak value previously saved by the transient waveform detection system. Upon determining a highest peak value, the total duration time {Da+Db+Dc} is saved

V.4—Waveform Sample Period 4

At the beginning of the fourth waveform sample period, the transient has a peak value of Pd with a corresponding duration of Dd. The peak value Pd is lower than the previous peak value Pc of the immediately preceding waveform sample period 3. At approximately the midpoint of the fourth waveform sample period, the transient crosses below the positive threshold but remains above the negative threshold. Thus the state machine 206 enters into State (5) as long as the transient is above the positive threshold. As the transient crosses below the positive threshold but remains above the negative threshold, the state machine transitions from State (5) to State (1).

V.5—Fifth Waveform Sample Period

During waveform sample period 5, the transient goes below the positive threshold but remains above the negative threshold so that there are no new transients or higher peak values of a continuing transient from a previous waveform sample period for this fifth waveform sample period since Pd is less than Pc. At the end of this fifth waveform sample period, the latches for the transient detect controller 114 are: Pd, Dd, S=0, C=0, NF=0 and the IED 10 does not replace Pd for Pc as having the highest peak value for the transient since Pc has a higher peak value. The total duration saved by the IED 10 is
{Da+Db+Dc+Dd} for this transient having the highest peak value at Pc.

VI. Sixth Example

FIG. 6(*f*) illustrates an example of the operation of state machine 206 when a transient exceeds both the positive and negative thresholds during the same waveform sample period. At the beginning of waveform sample period 1, the transient is shown to be below the positive threshold and above the negative threshold. Accordingly, the state machine 206 enters into State (4) with no peak transient present. When the transient goes above the positive threshold and reaches a peak value of Pa for a duration Da, the state machine transitions from State (4) to State (0). Thereafter, the transient declines below the positive threshold and the state machine 206 transitions from State (0) to State 1. The transient continues to decline and crosses the negative threshold with the state machine transitioning from State (1) to State (3). The transient declines further below the negative threshold, indicating a second transient peak value of Pb and associated duration Db with the state machine transitioning from State (3) to State (2). It should be appreciated that transient peaks are evaluated according to their absolute values (i.e., magnitudes). In the instant example, the magnitude of Pb is greater than the magnitude of Pa. Accordingly, Pb is saved by the transient waveform detection system as the highest peak value for this transient.

At the end of duration Db for peak value Pb, the transient crosses above the negative threshold and the state machine transitions from State (2) to State (1) and but remains in a region for the remainder of waveform sample period 1 above the negative threshold below the positive threshold. As such, there are no other transient peak values in waveform sample period 1. At the end of waveform sample period 1, the latch values for the transient detector 114 are: Pb, Db, S=1 (the negative threshold has the highest peak transient value), C=0 (the transient is not a conintuation from a previous waveform sample period) and NF=1 (the transient is a new transient).

It is noted that the present disclosure also contemplates an embodiment in which the software of the waveform transient detection system may be configured to detect and report both the maximum peak values of both positive transients and negative transients for a given waveform sample period.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. An intelligent electronic device (IED) for detecting at least one transient in at least one voltage waveform of a power distribution system comprising:
   at least one analog-to-digital converter configured to sample at least one analog voltage input channel coupled to the power distribution system at a first sampling rate and output digital voltage samples in each of a plurality of successive waveform sample periods, each waveform sample period comprising a predetermined time period, wherein a beginning of each waveform sample period defines a first boundary and an end of each waveform sample period defines a second boundary; and
   a transient detection system configured to receive the digital voltage samples from the at least one analog-to-digital converter in each of the plurality of waveform sample periods, the transient detection system including a first state machine configured to detect and store a single peak transient value and a duration value of a transient in each of the plurality of waveform sample periods based on states of the first state machine, wherein the first state machine transitions between different states based on a number of peaks detected in each waveform sample period, a position of the digital voltage samples with respect to a pre-determined transient threshold level, and the position of the digital voltage samples with respect to at least one boundary of each waveform sample period.

2. The IED of claim 1, wherein the transient detection system includes:
   a threshold comparator for detecting whether a digital voltage sample is above the pre-determined transient threshold level;
   a duration counter for measuring a duration of a detected transient based on the threshold comparator;
   a peak comparator for detecting the peak value of the digital voltage samples that may occur in each of the plurality of waveform sample periods; and
   a transient capture memory for storing the digital voltage samples of the at least one analog voltage input channel in each of the plurality of sequential waveform sample periods,
   wherein, the first state machine receives inputs from the threshold comparator and the peak comparator to transition between states.

3. The IED of claim 2, wherein the transient detection system includes a subtractor circuit that receives the digital voltage samples from the at least one analog voltage input channel, wherein the subtractor circuit is configured to determine phase to phase voltages or phase to neutral voltages.

4. The IED of claim 2, wherein the transient capture memory is one of an internal transient capture memory contained within the transient detection system or an external transient capture memory not contained within the transient detection system.

5. The IED of claim 2, wherein the transient detection system includes an intermediate holding register for temporarily holding parameter values collected by the first state machine during each of the plurality of waveform sample periods.

6. The IED of claim 5, wherein the parameter values comprise: (a) a peak transient value, (b) a continuation value for indicating that a transient value remained above the pre-determined transient threshold level when crossing over from one waveform sample period to an adjoining waveform sample period, (c) a new transient value N for indicating that the transient was not a carryover from a previous waveform sample period and (d) a duration value indicating a duration of the peak transient value.

7. The IED of claim 1, further comprising a waveform capture circuit configured to sample the at least one analog voltage input channel coupled to the power distribution system at a second sampling rate and output digital samples in each of the plurality of sequential waveform sample periods.

8. The IED of claim 7, wherein the at least one analog-to-digital converter and the waveform capture circuit sample the at least one analog voltage input channel simultaneously, the first sampling rate being faster than the second sampling rate.

9. The IED of claim 8, further comprising at least one processor configured to produce merged waveform data in each of the plurality of waveform sample periods by combining the single detected peak transient value and associated duration value together with the digital voltage samples of the waveform capture circuit.

10. The IED of claim 8, wherein the first sampling rate is about 1 Mhz or higher.

11. The IED of claim 8, wherein the first sampling rate is substantially in the range from 1 MHz to 50 MHz.

12. The IED of claim 2, wherein the transient detection system is further configured to detect whether a digital voltage sample is below a pre-determined negative transient threshold level.

13. The IED of claim 1, further comprising at least one processing device configured to determine energy usage data from voltage samples of at least one analog voltage input channel coupled to the power distribution system and a display for displaying the determined energy usage data.

14. The IED of claim 13, further comprising a communication device for communicating the determined energy usage data to an external device via a communication protocol.

15. The IED of claim 14, wherein the communication protocol is an Ethernet protocol.

16. The IED of claim 13, further comprising input/output (I/O) interface for communicating the determined energy usage data to an external device via a pulse output.

17. The IED of claim 1, further comprising a communication device that communicates data to an external device.

18. The IED of claim 1, further comprising a web server for communicating data to an external device.

19. The IED of claim 1, wherein the at least one analog-to-digital converter and the transient detection system are disposed in a socket-type meter form.

20. The IED of claim 1, wherein the at least one analog-to-digital converter and the transient detection system are disposed in a panel mounted meter form.

21. The IED of claim 1, wherein the at least one analog-to-digital converter and the transient detection system are disposed in a switchboard meter form.

22. The IED of claim 1, wherein the at least one analog-to-digital converter and the transient detection system are disposed in a A-base front wired meter form.

23. The IED of claim 1, wherein the at least one analog-to-digital converter and the transient detection system are disposed in a circuit breaker mounted meter form.

24. The IED of claim 1, further comprising a touchscreen display configured to display data and receive input commands.

25. The IED of claim 1, further comprising a communication device configured to couple the IED to a network, wherein the communication device operates on a wireless protocol.

26. The IED of claim 1, wherein the first sampling rate is about 10 Mhz.

27. The IED of claim 9, further comprising a web server for communicating the merged waveform data to an external device.

28. The IED of claim of 18, wherein the data include a transient waveform image.

29. The IED of claim 1, further comprising a communication device for communicating a transient waveform image to an external device.

30. The IED of claim 1, further comprising a memory configured to store at least one of a peak transient value, a duration of the transient and/or a time stamp of the transient.

31. The IED of claim 1, further comprising a communication device that communicates to at least one other device via a RS485 connection.

32. The IED of claim 1, further comprising a communication device that communicates to at least one other device via an infrared connection.

33. The IED of claim 1, wherein the pre-determined transient threshold level is settable by a user.

34. The IED of claim 1, further comprising a transient capture memory for storing the digital voltage samples of the at least one analog voltage input channel when the values of the digital voltage samples are above the pre-determined transient threshold such that the single peak transient value is stored along with digital voltage samples before and after the single peak transient value occurred.

35. The IED of claim 1, further comprising a transient capture memory for storing the digital voltage samples of the at least one analog voltage input channel when the values of the digital voltage samples are above the pre-determined transient threshold in a waveform sample period such that the single peak transient value is stored along with digital voltage samples from the beginning of the waveform sample period and after the single peak transient value occurred.

36. The IED of claim 1, further comprising a memory configured to store at least one of a peak transient value, a duration of the transient and/or a sign of the transient, the sign of the transient being positive or negative.

37. The IED of claim 1, further comprising a memory configured to store a plurality of transient magnitude/duration pairs for each voltage waveform.

* * * * *